US006454860B2

(12) United States Patent
Metzner et al.

(10) Patent No.: US 6,454,860 B2
(45) Date of Patent: *Sep. 24, 2002

(54) DEPOSITION REACTOR HAVING VAPORIZING, MIXING AND CLEANING CAPABILITIES

(75) Inventors: Craig R. Metzner, Fremont; Turgut Sahin, Cupertino; Gregory F. Redinbo, San Jose; Pravin K. Narwankar, Sunnyvale; Patricia M. Liu, Saratoga, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/179,921

(22) Filed: Oct. 27, 1998

(51) Int. Cl.[7] .............................................. C23C 16/00
(52) U.S. Cl. ........................ 118/715; 156/345; 239/1; 239/548; 239/597; 239/601
(58) Field of Search .................... 239/1, 548, 597, 239/601; 118/715; 156/345

(56) References Cited

U.S. PATENT DOCUMENTS

| 4,748,135 A | * 5/1988 | Frijlink | 118/715 |
| 4,854,263 A | * 8/1989 | Chang | 118/715 |
| 4,872,947 A | 10/1989 | Wang et al. | 156/643 |
| 5,174,825 A | * 12/1992 | White | 118/715 |
| 5,188,671 A | * 2/1993 | Zinck | 118/715 |
| 5,284,519 A | * 2/1994 | Gadgil | 118/715 |
| 5,304,247 A | * 4/1994 | Kondo | 118/715 |
| 5,419,924 A | 5/1995 | Nagashima et al. | 427/248.1 |
| 5,846,330 A | * 12/1998 | Quirk | 118/715 |
| 5,950,925 A | * 9/1999 | Fukunaga | 118/715 |
| 5,976,260 A | * 11/1999 | Kinoshita | 118/725 |
| 6,024,799 A | * 2/2000 | Chen | 118/715 |
| 6,106,625 A | * 8/2000 | Koai | 118/715 |
| 6,162,709 A | * 12/2000 | Raoux | 438/513 |

FOREIGN PATENT DOCUMENTS

| JP | 61-143579 | * 7/1986 | 118/723 |
| JP | 63-260124 | * 10/1988 | 118/715 |

* cited by examiner

Primary Examiner—Richard Bueker
(74) Attorney, Agent, or Firm—Blakely Sokoloff Taylor & Zafman

(57) ABSTRACT

An integrated deposition system is provided which is capable of vaporizing low vapor pressure liquid precursors and delivering this vapor into a processing region for use in the fabrication of advanced integrated circuits. The integrated deposition system is made up of a heated exhaust system, a remote plasma generator, a processing chamber and a liquid delivery system which together provide a commercially viable and production worthy system for depositing high capacity dielectric materials from low vapor pressure precursors, anneal those films while also providing commercially viable in-situ cleaning capability.

22 Claims, 21 Drawing Sheets

FIG. 11

| ROW NUMBER | NO. OF HOLES | FIRST HOLE X LOCATION IN A ROW Xi | FIRST HOLE Y LOCATION IN A ROW Yi |
|---|---|---|---|
| 1 | 2 | 0.109 | 4.531 |
| 2 | 11 | 0.090 | 4.342 |
| 3 | 16 | 1.635 | 4.153 |
| 4 | 21 | 2.180 | 3.965 |
| 5 | 24 | 2.507 | 3.776 |
| 6 | 25 | 2.616 | 3.587 |
| 7 | 28 | 2.943 | 3.398 |
| 8 | 29 | 3.052 | 3.209 |
| 9 | 32 | 3.379 | 3.021 |
| 10 | 33 | 3.488 | 2.832 |
| 11 | 34 | 3.597 | 2.643 |
| 12 | 35 | 3.706 | 2.454 |
| 13 | 36 | 3.815 | 2.266 |
| 14 | 37 | 3.924 | 2.077 |
| 15 | 38 | 4.033 | 1.888 |
| 16 | 39 | 4.142 | 1.699 |
| 17 | 40 | 4.251 | 1.510 |
| 18 | 39 | 4.142 | 1.322 |
| 19 | 40 | 4.251 | 1.133 |
| 20 | 41 | 4.360 | 0.944 |
| 21 | 42 | 4.469 | 0.755 |
| 22 | 41 | 4.360 | 0.566 |
| 23 | 42 | 4.469 | 0.378 |
| 24 | 41 | 4.360 | 0.189 |
| 25 | 42 | 4.469 | 0.000 |
| 26 | 41 | 4.360 | -0.189 |
| 27 | 42 | 4.469 | -0.378 |
| 28 | 41 | 4.360 | -0.566 |
| 29 | 42 | 4.469 | -0.755 |
| 30 | 41 | 4.360 | -0.944 |
| 31 | 40 | 4.251 | -1.133 |
| 32 | 39 | 4.142 | -1.322 |
| 33 | 40 | 4.251 | -1.510 |
| 34 | 39 | 4.142 | -1.699 |
| 35 | 38 | 4.033 | -1.888 |
| 36 | 37 | 3.924 | -2.077 |
| 37 | 36 | 3.815 | -2.266 |
| 38 | 35 | 3.706 | -2.454 |
| 39 | 34 | 3.597 | -2.643 |
| 40 | 33 | 3.488 | -2.832 |
| 41 | 32 | 3.379 | -3.021 |
| 42 | 29 | 3.052 | -3.209 |
| 43 | 28 | 2.943 | -3.398 |
| 44 | 25 | 2.616 | -3.587 |
| 45 | 24 | 2.507 | -3.776 |
| 46 | 21 | 2.180 | -3.965 |
| 47 | 16 | 1.635 | -4.153 |
| 48 | 11 | 1.090 | -4.342 |
| 49 | 2 | 0.109 | -4.531 |

FIG. 12

| ROW NUMBER | NO. OF HOLES | FIRST HOLE X LOCATION IN A ROW $X_i$ | FIRST HOLE Y LOCATION IN A ROW $Y_i$ |
|---|---|---|---|
| 1 | 8 | 0.343 | 3.989 |
| 2 | 19 | 0.882 | 3.904 |
| 3 | 26 | 1.225 | 3.819 |
| 4 | 31 | 1.470 | 3.734 |
| 5 | 34 | 1.617 | 3.649 |
| 6 | 39 | 1.862 | 3.565 |
| 7 | 42 | 2.009 | 3.480 |
| 8 | 45 | 2.156 | 3.395 |
| 9 | 48 | 2.303 | 3.310 |
| 10 | 49 | 2.352 | 3.225 |
| 11 | 52 | 2.499 | 3.140 |
| 12 | 55 | 2.646 | 3.055 |
| 13 | 56 | 2.695 | 2.970 |
| 14 | 59 | 2.842 | 2.886 |
| 15 | 60 | 2.891 | 2.801 |
| 16 | 61 | 2.940 | 2.716 |
| 17 | 62 | 2.989 | 2.631 |
| 18 | 65 | 3.136 | 2.546 |
| 19 | 66 | 3.185 | 2.461 |
| 20 | 67 | 3.234 | 2.376 |
| 21 | 68 | 3.283 | 2.292 |
| 22 | 69 | 3.332 | 2.207 |
| 23 | 70 | 3.381 | 2.122 |
| 24 | 71 | 3.430 | 2.037 |
| 25 | 72 | 3.479 | 1.952 |
| 26 | 73 | 3.528 | 1.867 |
| 27 | 74 | 3.577 | 1.782 |
| 28 | 75 | 3.626 | 1.697 |
| 29 | 76 | 3.675 | 1.613 |
| 30 | 77 | 3.724 | 1.528 |
| 31 | 76 | 3.675 | 1.443 |
| 32 | 79 | 3.822 | 1.358 |
| 33 | 78 | 3.773 | 1.273 |
| 34 | 79 | 3.822 | 1.188 |
| 35 | 80 | 3.871 | 1.103 |
| 36 | 81 | 3.920 | 1.018 |
| 37 | 80 | 3.871 | 0.934 |
| 38 | 81 | 3.920 | 0.849 |
| 39 | 80 | 3.871 | 0.764 |
| 40 | 81 | 3.920 | 0.679 |
| 41 | 82 | 3.969 | 0.594 |
| 42 | 83 | 4.018 | 0.509 |
| 43 | 82 | 3.969 | 0.424 |
| 44 | 83 | 4.018 | 0.339 |
| 45 | 82 | 3.969 | 0.255 |
| 46 | 83 | 4.018 | 0.170 |
| 47 | 82 | 3.969 | 0.085 |
| 48 | 83 | 4.018 | 0.000 |

FIG. 12 (cont.)

| ROW NUMBER | NO. OF HOLES | FIRST HOLE X LOCATION IN A ROW $X_i$ | FIRST HOLE Y LOCATION IN A ROW $Y_i$ |
|---|---|---|---|
| 49 | 82 | 3.969 | -0.085 |
| 50 | 83 | 4.018 | -0.170 |
| 51 | 82 | 3.969 | -0.255 |
| 52 | 83 | 4.018 | -0.339 |
| 53 | 82 | 3.969 | -0.424 |
| 54 | 83 | 4.018 | -0.509 |
| 55 | 82 | 3.969 | -0.594 |
| 56 | 81 | 3.920 | -0.679 |
| 57 | 80 | 3.871 | -0.764 |
| 58 | 81 | 3.920 | -0.849 |
| 59 | 80 | 3.871 | -0.934 |
| 60 | 81 | 3.920 | -1.018 |
| 61 | 80 | 3.871 | -1.103 |
| 62 | 79 | 3.822 | -1.188 |
| 63 | 78 | 3.773 | -1.273 |
| 64 | 79 | 3.822 | -1.358 |
| 65 | 76 | 3.675 | -1.443 |
| 66 | 77 | 3.724 | -1.528 |
| 67 | 76 | 3.675 | -1.613 |
| 68 | 75 | 3.626 | -1.697 |
| 69 | 74 | 3.577 | -1.782 |
| 70 | 73 | 3.528 | -1.867 |
| 71 | 72 | 3.479 | -1.952 |
| 72 | 71 | 3.430 | -2.037 |
| 73 | 70 | 3.381 | -2.122 |
| 74 | 69 | 3.332 | -2.207 |
| 75 | 68 | 3.283 | -2.292 |
| 76 | 67 | 3.234 | -2.376 |
| 77 | 66 | 3.185 | -2.461 |
| 78 | 65 | 3.136 | -2.546 |
| 79 | 62 | 2.989 | -2.631 |
| 80 | 61 | 2.940 | -2.716 |
| 81 | 60 | 2.891 | -2.801 |
| 82 | 59 | 2.842 | -2.886 |
| 83 | 56 | 2.695 | -2.970 |
| 84 | 55 | 2.646 | -3.055 |
| 85 | 52 | 2.499 | -3.140 |
| 86 | 49 | 2.352 | -3.225 |
| 87 | 48 | 2.303 | -3.310 |
| 88 | 45 | 2.156 | -3.395 |
| 89 | 42 | 2.009 | -3.480 |
| 90 | 39 | 1.862 | -3.565 |
| 91 | 34 | 1.617 | -3.649 |
| 92 | 31 | 1.470 | -3.734 |
| 93 | 26 | 1.225 | -3.819 |
| 94 | 19 | 0.882 | -3.904 |
| 95 | 8 | 0.343 | -3.989 |

REMOTE MICROWAVE PLASMA APPARATUS 400

FIG. 21

| Liquid Alignment Configuration | Bulk Source 503 contains: | 3 Way Valve 545 Position | Bulk Source 504 contains: | 3 Way Valve 570 Position | Process Gas Source 580 contains: | Vapor Delivered to Process Region 202 |
|---|---|---|---|---|---|---|
| 1 | Tantalum | Chamber (550 open) | N/A | By-pass (572 open) | Oxygen | Tantalum Oxide |
| 2 | Tantalum | Chamber (550 open) | Aluminum | Chamber (571 open) | Oxygen | Aluminum doped Tantalum Oxide |
| 3 | Tantalum | Chamber (550 open) | Titanium | Chamber (571 open) | Oxygen | Tantalum doped Tantalum Oxide |
| 4 | Tantalum | Chamber (550 open) | Dopant | Chamber (571 open) | Oxygen | Doped Tantalum Oxide |
| 5 | N/A | By-pass (555 open) | Aluminum | Chamber (571 open) | Oxygen | Aluminum Oxide |
| 6 | N/A | By-pass (555 open) | Titanium | Chamber (571 open) | Oxygen | Titanium Oxide |
| 7 | N/A | By-pass (555 open) | Dielectric Source | Chamber (571 open) | Oxygen | Dielectric Mixture |
| 8 | N/A | By-pass (555 open) | Aluminum | Chamber (571 open) | Nitrogen or NH3 | Aluminum based electrode mixture |
| 9 | N/A | By-pass (555 open) | Titanium | Chamber (571 open) | Nitrogen or NH3 | Titanium based electrode mixture |
| 10 | N/A | By-pass (555 open) | Electrode Source | Chamber (571 open) | Nitrogen or NH3 | Electrode Mixture |

DEPOSITION REACTOR HAVING VAPORIZING, MIXING AND CLEANING CAPABILITIES

BACKGROUND OF THE INVENTION

1. Field of the Invention

This invention relates to an apparatus and process for the vaporization of liquid precursors and the controlled delivery of those precursors to form films on suitable substrates. More particularly, this invention relates to an apparatus and a method for the deposition of a high dielectric constant film, such as Tantalum Oxide ($Ta_2O_5$), on a silicon wafer to make integrated circuits useful in the manufacture of advanced dynamic random access memory (DRAM) modules and other semiconductor devices.

2. Background of the Invention

The desire for greater capacity integrated circuits (ICs) on smaller sized devices has increased interest in replacing today's 64 megabit DRAM with memory devices in the range of 256 megabit, 1 gigabit and higher. This need for increased capacity on the same or smaller substrate footprint device makes it necessary to replace conventional dielectric films previously used in stacked capacitor formation, such as silicon dioxide ($SiO_2$), with dielectric films having higher dielectric constants. Capacitors containing high-dielectric constant materials, such as $Ta_2O_5$, usually have much larger capacitance densities than standard $SiO_2$—$Si_3N_4$—$SiO_2$ stack capacitors making them the materials of choice in IC fabrication. High dielectric constant films are desirable because they provide higher capacitance which enables closer spacing of devices without electrical interference which can increase transistor density. One material of increasing interest for stack capacitor fabrication is Tantalum Oxide which has a relative dielectric constant more than six times that of $SiO_2$.

One common method of forming Tantalum oxide film is to vaporize a liquid Tantalum precursor and then deliver the Tantalum vapor to a deposition chamber. Such vapor delivery methods face numerous challenges because of the low vapor pressure of typical Tantalum precursors such as (Ta($OC2H_5$)$_5$) or TAETO and Tantalum Tetraethoxide Dimethylaminoethoxide (Ta(OEt)$_4$(OCH$_2$CH$_2$N(Me)$_2$) or TAT-DMAE, both of which are liquid at room temperature and pressure. FIG. 1 graphically illustrates the large variation between the vapor pressure of Tantalum precursors and other representative prior-art precursors for other semiconductor related processes. For example, at 100° C. and 1 atm TAT-DMAE has about 0.3 Torr vapor pressure while TAETO has about 0.03 Torr vapor pressure. The vapor pressures for Tantalum precursors are remarkably lower than those precursors typically used in prior art vapor delivery systems which are intended to vaporize precursors having much higher vapor pressures. Again referring to FIG. 1, at 100° C. and 1 atm, TEOS, (Tetra Ethyl Ortho-Silicate) which is commonly used in chemical vapor deposition processes to form $SiO_2$ films and is the subject of several prior art vapor delivery systems, has a vapor pressure of almost 100 Torr. As a result of this vast difference in vapor pressure, prior art vapor delivery systems did not encounter nor provide solutions to many of the challenges resulting from the use of very low vapor pressure precursors such as TAETO and TAT-DMAE.

Prior art vapor delivery systems commonly involved the use of an integrated liquid flow controller and vaporizer without a positive liquid shut-off valve. Such a configuration, when used with low vapor pressure Tantalum precursors, can lead to problems stabilizing the Tantalum vapor output and difficulty achieving the constant, repeatable Tantalum vapor output desirous in semiconductor device fabrication. Previous delivery systems, based upon experience with TEOS and other relatively high vapor pressure materials, allow for the flow controller and vaporizer to be separated by considerable distance or attach no significance to the distance between vaporizer and liquid flow meter. Positioning the vaporizer and flow meter according to prior art systems fail to adequately control Tantalum precursor vapor. Previous delivery systems are intended for use with higher vapor pressure precursors whose residuals can be adequately removed by applying low pressure or "pumping-down" the lines while flowing an inert gas like nitrogen. Purging techniques such as these fail with Tantalum systems because the low vapor pressure residual tantalum vapor creates a need to introduce a solvent, such as isopropyl alcohol, ethanol, hexane, or methanol into both the vaporization system and supply lines to remove residual Tantalum precursor vapor.

Previous vapor delivery systems avoided precursor vapor condensation by heating the delivery lines usually by resorting to a flexible resistive heater which is wrapped around and held in direct contact with the line, and then insulated. Since such systems typically operated with precursor materials having a wide temperature range within which the precursor remains vaporous, the requirement to sample the temperature of any section of the heated line was low and typically a single thermocouple would be used to represent the temperature of piping sections as long as four to six feet. Since the object of large scale temperature control systems, such as wrapped lines and jacket-type heaters used in prior art systems, is to heat and monitor an average temperature of a large section of piping, such systems lack the ability to specifically control a single, smaller section of the vapor piping and generally have very low efficiency when higher line temperatures are desired. Vaporized Tantalum delivery systems maintain the Tantalum vapor above the vaporization temperature but below the decomposition temperature for a given Tantalum precursor. Once formed, the vaporous Tantalum must be maintained at elevated temperatures between about 130° C. and 190° C. for TAT-DMAE and between about 150° C. and 220° C. for TAETO. Because of the relatively high temperatures needed and the narrow temperature band available to low vapor pressure precursors such as TAT-DMAE and TAETO, Tantalum and other low vapor pressure liquid delivery systems would benefit from vapor delivery line temperature controls and methods which can achieve and efficiently provide the higher temperatures and greater temperature control needed for Tantalum vapor delivery. Additionally, finer temperature controls are desirous since the useable temperature range of vaporized low pressure liquids is smaller than prior art liquids. Because higher temperature vapor delivery is needed, Tantalum delivery systems would benefit from designs which minimize the length of heated vapor delivery lines. Minimizing the length of lines requiring heating not only reduces the overall system complexity but also decreases the footprint or overall size of the system.

Current methods of Tantalum Oxide deposition use reaction rate limited chemical vapor deposition techniques. In reaction rate limited deposition processes, the deposition rate achieved under these conditions is largely influenced by the temperature of the reaction environment. Existing chemical vapor deposition reactors do not sufficiently address the thermal losses between the substrate onto which the Tantalum film is to be formed and internal chamber components such as the gas distribution showerhead. Such thermal losses and the resultant non-uniform thickness of deposited Tantalum illustrate the barriers to commercially viable Tantalum oxide film formation techniques. However, with commercially viable Tantalum deposition rates also comes the need for a viable, insitu cleaning process which can remove Tantalum deposition formed on internal chamber components without harm to these components.

There is a need for a Tantalum deposition apparatus which can deliver vaporized, measured Tantalum precursors which have been adequately mixed with process gases to a reaction chamber which provides a controlled deposition environment which overcomes the shortcoming of the previous systems. Additionally, there is also a need for a deposition apparatus capable of in-situ cleaning.

SUMMARY OF THE INVENTION

In one aspect of the present invention, a deposition apparatus is provided for depositing tantalum oxides and other materials especially those with low vapor pressure liquid precursors which are provided as liquid to a vaporizer to be converted into the vapor phase. The vapor is then transported from the vaporizer into a substrate processing region via temperature controlled conduits where the temperature within the conduits allows neither condensation nor decomposition of the vaporized precursor. Separate thermocouple, heater, controller units control the temperature conduits so as to maintain a temperature within the conduit above the condensation temperature but below the decomposition temperature of a given precursor vapor or, more particularly, between about 130° C. and 190° C. for a Tantalum precursor such as TAT-DMAE or between about 150° C. and 220° C. for a Tantalum precursor such as TAETO. Additionally, the temperature controlled conduits could provide a temperature gradient along the vapor flow path between the vaporizer and the processing region. Other precursor source materials and dopants, alone or in combination, are also contemplated.

In another aspect of the present invention, a resistive heater is embedded in the lid of the processing chamber which provides for elevated temperatures within the gas box formed between the lid and the showerhead gas distribution plate.

In another aspect of the showerhead gas distribution plate of the present invention, the specific shape and spacing of the apertures which allow gas to enter into the processing region of the processing chamber present an angled lower surface towards a substrate within the processing region. The spacing and specific shape of the apertures allow more incident energy from the substrate to be absorbed into instead of reflected off the showerhead or where the emissivity of the showerhead is increased by the angled lower surface. Another feature of the present invention is modifying the surface of the showerhead lower surface which faces a substrate in the processing region. The modification results in a surface which has a high emissivity relative to the emissivity changes which result from film accumulation on the surface of the showerhead as well as other factors. Each of these features alone or in combination helps minimize substrate heat losses which contribute to temperature non-conformities. The net effect of the aperture hole shapes, spacing and high emissivity modification or coating is that most of the radiation emitted from the substrate surface is absorbed by the showerhead.

In another aspect of the present invention, a deposition system is provided for depositing tantalum oxides and other materials, especially those with low vapor pressures alone or in combination with a variety of processing gases or dopants. The deposition system is comprised of a heated exhaust system, a liquid delivery system, a remote plasma generator, and a processing chamber. In operation, the deposition system provides a method and apparatus capable of the controlled delivery of a variety of vaporized, low vapor pressure liquid precursors and activated species into a substrate processing region for cleaning, deposition or other operations.

BRIEF DESCRIPTION OF THE FIGURES

FIG. 11 is a table listing the representative distribution of apertures 238;

FIG. 12 is a table listing the representative distribution of apertures 249;

FIG. 21 is a table summarizing Liquid Alignment Configurations of the vapor delivery system.

DETAILED DESCRIPTION OF THE INVENTION

The present invention is directed to a novel liquid delivery system, chemical vapor deposition (CVD) chamber, exhaust system and remote plasma generator which together comprise a unique system especially useful in depositing thin metal-oxide films as well as other films requiring vaporization of low volatility precursor liquids. The system also provides for an in-situ cleaning process for the removal of metal-oxide films deposited on interior surfaces of a deposition chamber. The system also has application in the use of fabricating metal-oxide dielectrics useful in making ultra large scale integration (ULSI) DRAM and other advanced feature electronic devices which require the deposition of high dielectric constant materials. In general, devices that can be made with the system of the present invention are those devices characterized by having one or more layers of insulating, dielectric or electrode material on a suitable substrate such as silicon. One skilled in the art will appreciate the ability to use alternative configuration and process details to the disclosed specifics without departing from the scope of the present invention. In other instances, well known semiconductor processing equipment and methodology have not been described in order not to unnecessarily obscure the present invention.

Figure 2:
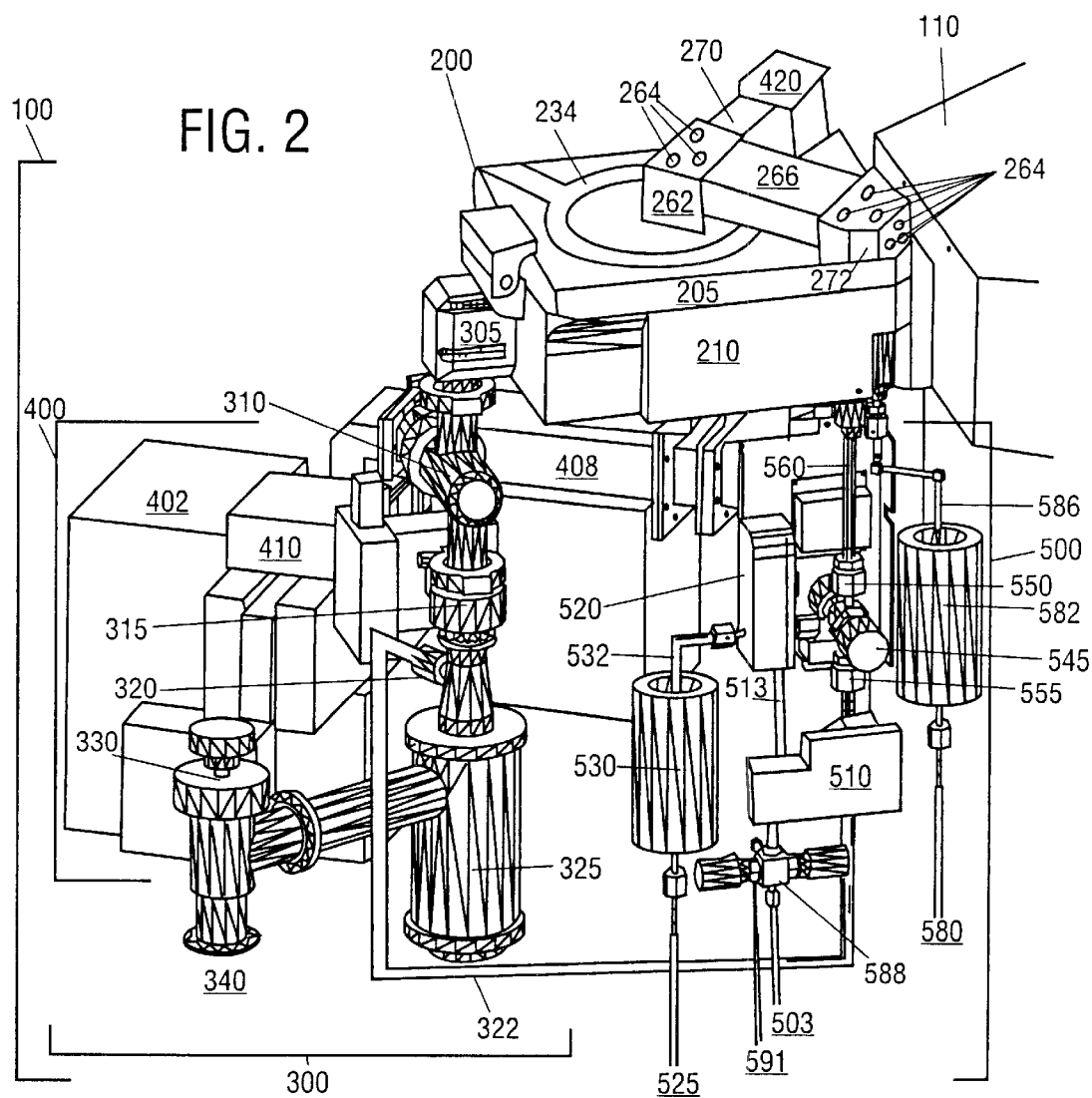
FIG. 2 is a perspective view of the processing system of the present invention.

FIG. 2 is a perspective view of the processing system 100 showing the relative positions of the main components of the present invention. System 100 contains a processing chamber 200, a heated exhaust system 300, a remote plasma generator 400 and a vapor delivery system 500. Also shown in FIG. 2 is a central substrate transfer chamber 110 representative of a cluster tool embodiment of the processing system of the present invention. Processing chamber 200 is comprised of lid 205 and chamber body 210 and is attached to central transfer chamber 110. Gases supplied via liquid delivery system 500 are provided into a processing region 202 (not shown) within chamber 200 via temperature controlled conduits formed within inlet block 272, mixing block 266 and central block 262. Cartridge style heaters 264 are integrally formed into each block and, in conjunction with individual thermocouples and controllers, maintain temperature set points within the conduits. For clarity, individual thermocouples and controllers have been omitted. Not visible in FIG. 2 but an aspect of the present invention is embedded lid heater 235 located integral to lid 205 beneath heater backing plate 234.

Chamber 200 processing by-products are exhausted via heated exhaust system 300 which is coupled to chamber 200 via exhaust port 305. Also shown are isolation valve 310, throttle valve 315, chamber by-pass 320, cold trap 325 and cold trap isolation valve 330. For clarity, specific embodiments of vacuum pump 335 and wafer fabrication plant exhaust treatment systems 340 are not shown. In order to provide a clearer representation of the interrelationship between and relative placement of each of the components of heated exhaust system 300, the jacket type heaters, thermocouples and controllers used to maintain setpoint temperatures in exhaust port 305, isolation valve 310, throttle valve 315, chamber by-pass 320, and by-pass line 322 have been omitted.

Activated species are generated by remote plasma generator 400 and provided to a processing region within chamber 200 via conduits within activated species inlet block 420, activated species block 270 and central block 262. Other components of remote plasma generator 400 such as magnetron 402, auto tuner controller 410, and auto tuner 408 are visible in FIG. 2.

One of the main components of liquid delivery system 500 is liquid flow meter 510 and vaporizer 520. Three-way inlet valve 588 allows either precursor 503 or solvent 591 into vapor delivery system 500. Heat exchangers 530 and 582 preheat carrier gases and process gases respectively. Heated carrier gases travel via a carrier gas supply line 532 to vaporizer 520 in order to facilitate more complete vaporization within vaporizer 520 as well as carry vaporized liquids to chamber 200. After vaporization in vaporizer 520, chamber by-pass valve 545 allows vapor to be ported either to processing region 202 in chamber 200 via outlet 582 or to exhaust system 300 via outlet 555 which is coupled to heated by-pass line 322. A jacket style heater, thermocouple and controller which maintain the temperature of chamber by-pass valve 545 and vaporized precursor line 560 as well as the jacket style heater, thermocouple and controller which maintain the temperature of by-pass line 322 have been omitted so as not to obscure the components of liquid delivery system 500 and their relationship to chamber 200 and heated exhaust system 300.

The size and dimensions of the various components and the placement of these components in relation to each other are determined by the size of the substrate on which the processes of the present invention are being performed. A preferred embodiment of the invention will be described herein with reference to a processing system 100 adapted to process a circular substrate, such as a silicon wafer, having a 200 mm diameter. Although described in reference to a single substrate, one of ordinary skill in the art of semiconductor processing will appreciate that the methods and various embodiments of the present invention are adaptable to the processing of multiple substrates within a single chamber 200.

Figure 3:
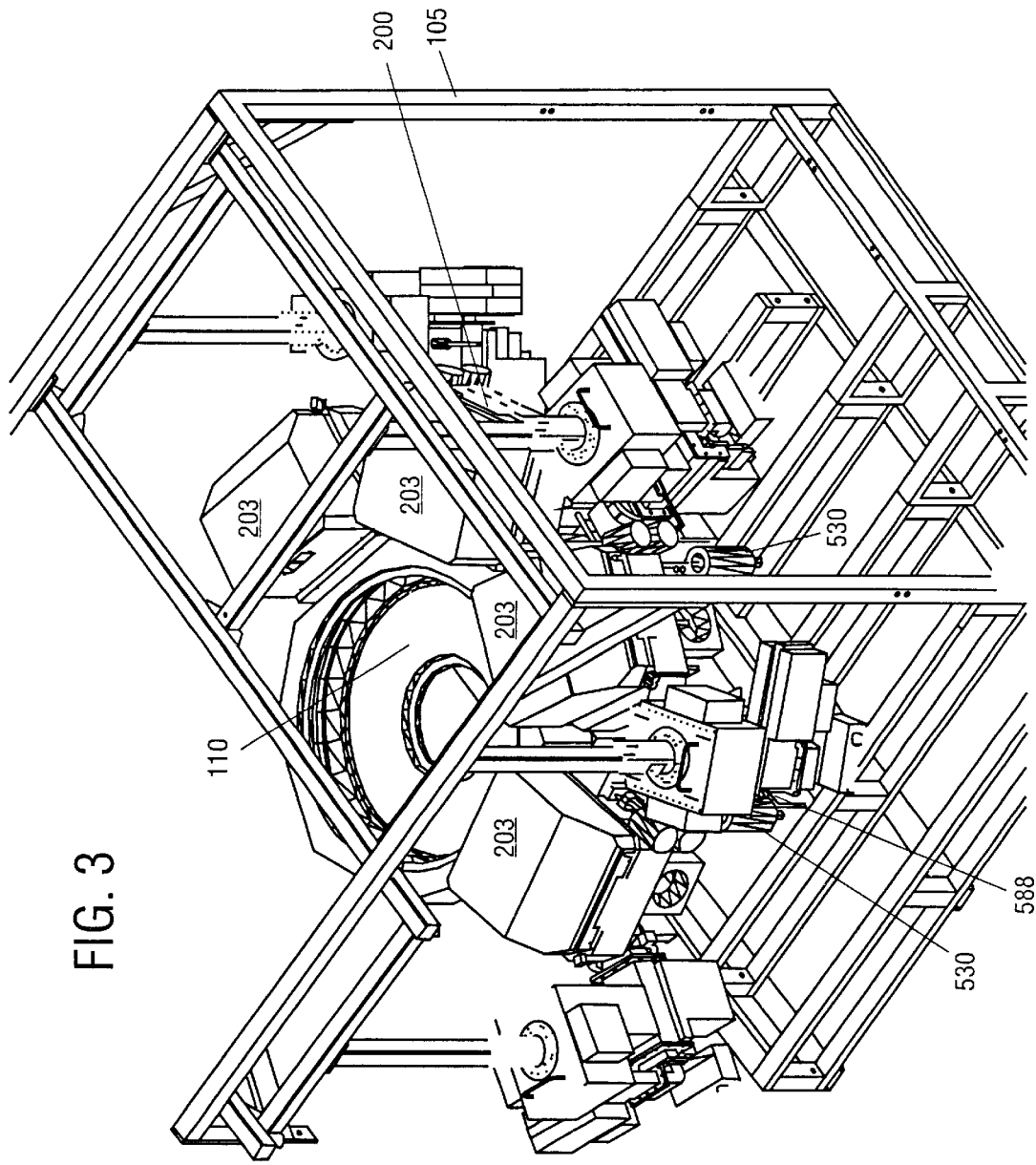
FIG. 3 is a perspective view of four representative processing systems of the present invention mounted on a typical central wafer handling system.

Turning now to FIG. 3, which is a perspective view of a plurality of processing systems 100 arranged in a cluster tool arrangement around central substrate transfer chamber 110 and supported by common mainframe support structure 105. The Centura® mainframe system, manufactured by Applied Materials, Inc. of Santa Clara, Calif., is representative of one such cluster tool arrangement. This arrangement allows multiple chambers, shown here comprising four processing systems 100 of the present invention, to share a common vacuum transfer 110. One advantage of such an arrangement is that the central substrate transfer also has attached to it a loadlock or loadlocks which hold a plurality of substrates for processing in chambers attached to the central substrate transfer 110. Although FIG. 3 illustrates four identical processing systems 100, another advantage of the cluster tool arrangement is the ability to place a variety of chamber types onto a single central substrate transfer 110. In such an arrangement, a substrate may move between chambers arranged around central substrate transfer 110 without exposure to an air or oxygen ambient. Not shown in FIG. 3, but a feature of the deposition system 100 of the present invention, either one or a plurality of deposition systems 100 may be arranged in communication with central substrate transfer 110 with a variety of predetermined chamber types such that a substrate could be loaded into the loadlock attached a central substrate transfer 110, sequence through the various chambers and as a result of the sequencing form predetermined and desirous films on a substrate processed in this manner. It is anticipated that deposition system 100, in conjunction with other chamber types, would be capable of forming complete portions of an IC. Specifically anticipated is the selection of chamber types, sequencing and liquid delivery configurations which would result in the formation of a representative stack capacitor having polysilicon bottom and top electrodes separated by silicon nitride and titanium nitride barrier layers which are separated by a tantalum oxide dielectric layer. Other layers and structures are also anticipated and are intended to be included within the capabilities of the methods and apparatus described herein. It is also specifically anticipated that a single deposition system 100 would alone have the processing capability of forming complete portions of an IC.

Chamber 200 is shown with protective cover 203 in place. Cover 203 encloses heated chamber lid 205 and temperature controlled conduit blocks 272, 266 and 262. Cover 203 is maintained at a relatively safe temperature so as to prevent burn injuries from contact with the heated components of lid 205.

Remote plasma generator 400 is also shown in an alternative embodiment in which the generator is supported from the top of mainframe 105 instead of from below as shown in FIG. 2. So as not to obstruct the view of an alternative embodiment of remote plasma generator 400, heated exhaust system 300 is not shown. Such a support arrangement of remote plasma generator 400 provides easier accessibility and maintenance of other components of deposition system 100 as well as contributing to the reduction of the overall footprint of deposition system 100. The embodiment of the plurality of processing systems 100 of FIG. 3 further illustrate the compact design features of system 100 of the present invention.

The Deposition Chamber

Figure 4:
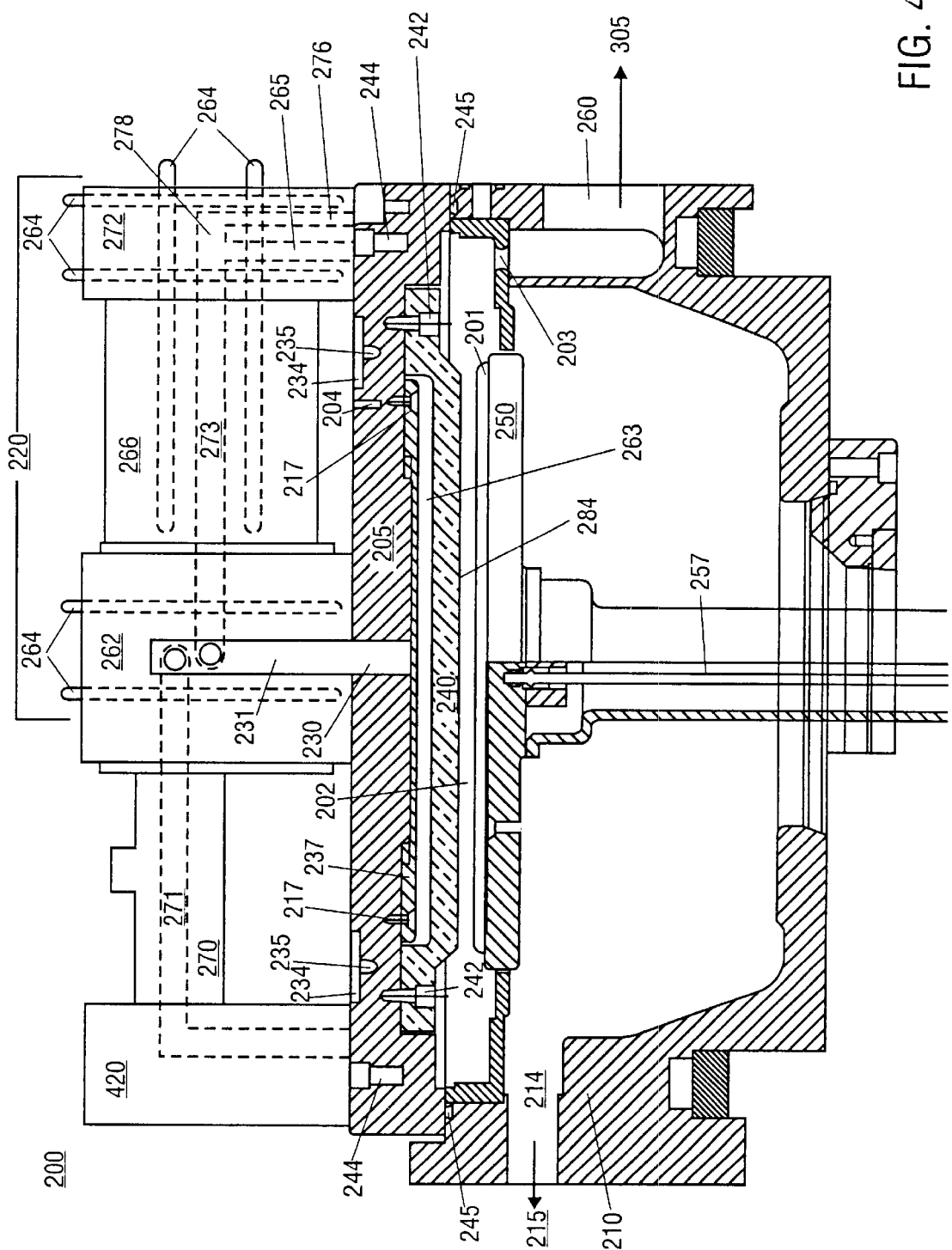
FIG. 4 is a cross sectional view of a processing chamber of the present invention.

FIG. 4 is a cross sectional view of chamber assembly 200 of processing system 100 of FIG. 2. Chamber body 210 and heated chamber lid 205, which is hingedly connected to chamber body 210, together with o-ring 245 form a temperature and pressure controlled environment or processing region 202 which enables deposition processes and other operations to be performed within processing region 202. Chamber body 210 and lid 205 are preferably made of a rigid material such as aluminum, various nickel alloys or other materials having good thermal conductivity. O-ring 245 could be formed from Chemraz, Kalrez, Viton or other suitable sealing material.

When lid 205 is closed as shown in FIG. 4, an annular processing region 202 is formed which is bounded by showerhead 240, substrate support 250 and the walls of chamber body 210. Substrate support 250 (shown in the raised position for processing) extends through the bottom of chamber body 210. Imbedded within substrate support 250 is a resistive heater which receives power via resistive heating element electrical connector 257. A thermocouple in thermal contact with substrate support 250 senses the temperature of substrate support 250 and is part of a closed loop control circuit which allows precise temperature control of heated substrate support 250. Substrate support 250 and substrate 201 are parallel to showerhead 240. Substrate 201 is supported by the upper surface of support 250 and is heated by the resistive heaters within substrate support 250 to processing temperatures of, for example, between about 400° C. and 500° C. for Tantalum films formed using the methods and apparatus of the present invention.

Processing chamber 200 is coupled to central transfer chamber 110 via opening 214. A slit valve 215 seals processing region 202 from central transfer chamber 110. Substrate support 250 may also move vertically into alignment with opening 214 which, when slit valve 215 is open, allows substrates to move between the processing region 202 and central substrate transfer chamber 110. Substrate 201 can be a substrate used in the manufacture of semiconductor products such as silicon substrates and gallium arsenide substrates and can be other substrates used for other purposes such as substrates used in the production of flat panel displays.

Pumping passage 203 and outlet port 260 formed within chamber body 210 for removing by products of processing operations conducted within processing region 202. Outlet port 260 provides fluid communication between components of heated exhaust system 300 and processing region 202.

Turning now to gas delivery features of chamber 200, both process gas/precursor mixture from liquid delivery system 500, via conduit 273, and activated species from remote plasma generator system 400, via conduit 271, flow through central conduit 231 to bore through 230 formed in lid 205. From there, gases and activated species flow through blocker plate 237 and showerhead 240 into processing region 202. A feature of showerhead 240 of the present invention is the plurality of apertures 249, or alternative aperture embodiment 238, which are not indicated in FIG. 4 so as not to unnecessarily obscure understanding specific details and features of chamber 200 and heated lid 205.

Process gas and vaporized precursors and mixtures thereof are provided to central bore through 230 via temperature controlled conduits formed integral to heated feed through assembly 220. Heated feed through assembly 220 is comprised of central block 262, mixed deposition gas feed through block 266 and inlet and mixing block 272. Although the embodiment represented in chamber 200 of FIG. 4 indicates a heated feed through assembly 220 comprising three separate blocks 262, 266 and 272, one of ordinary skill will appreciate that the blocks can be combined such as replacing inlet and mixing block 272 and feed through block 266 with a single block without departing from the spirit of the present invention. Additionally, a plurality of cartridge heaters 264 are disposed internal to each of the aforementioned blocks and proximate to the conduits 231, 273, 278, 265, and 276 which maintain a setpoint in each conduit utilizing separate controllers and thermocouples for the heater of a particular conduit. For clarity, the separate thermocouples and controllers have been omitted.

Lid 205 is also provided with a cooling channel 244 which circulates cooling water within that portion of lid 205 in proximity to o-ring 245. Cooling channel 244 allows lid 205 to maintain the temperatures preferred for advantageous heating of showerhead 240 while protecting o-ring 245 from the high temperatures which degrade the sealing qualities of o-ring 245 thereby making o-ring 245 more susceptible to attack by the reactive species generated and supplied to processing region 202 by remote plasma generator 400.

Another feature of processing chamber 200 of the present invention also shown in FIG. 4 is embedded resistive heater 235 within lid 205. This feature of chamber assembly 200 provides elevated temperatures in lid 205 in proximity to central bore through 230 and the area between the lower surface of the lid 205 and showerhead upper surface 263. The region between lid 205 and showerhead upper surface 263 is referred to as the "gas box". Formed within the top surface of lid 205 is an annular groove shaped according to the size and shape of imbedded heater 235 in order to increase surface contact and heat transfer between resistive heater 235 and lid 205. Without heater 235, cooling channel 244 could continuously remove heat from lid 205. As a result, cooling channel 244 also affects the temperature of portions of lid 205 in contact with precursor vapor, such as the area surrounding central bore through 230 and the gas box. While cooler lid 205 temperatures improve conditions for o-ring 245, cooler lid 205 temperatures could result in undesired condensation of precursor vapor. Thus, it is to be appreciated that resistive heater 235 is positioned to heat those portions of lid 205 in contact with the vaporized precursor flow such as the gas box and the area surrounding central bore through 230. As shown in FIG. 4, for example, heater 235 is located between cooling channel 244 and central bore through 230 while also positioned to provide heating to the lid surface adjacent to blocker plate 237.

Figure 5:
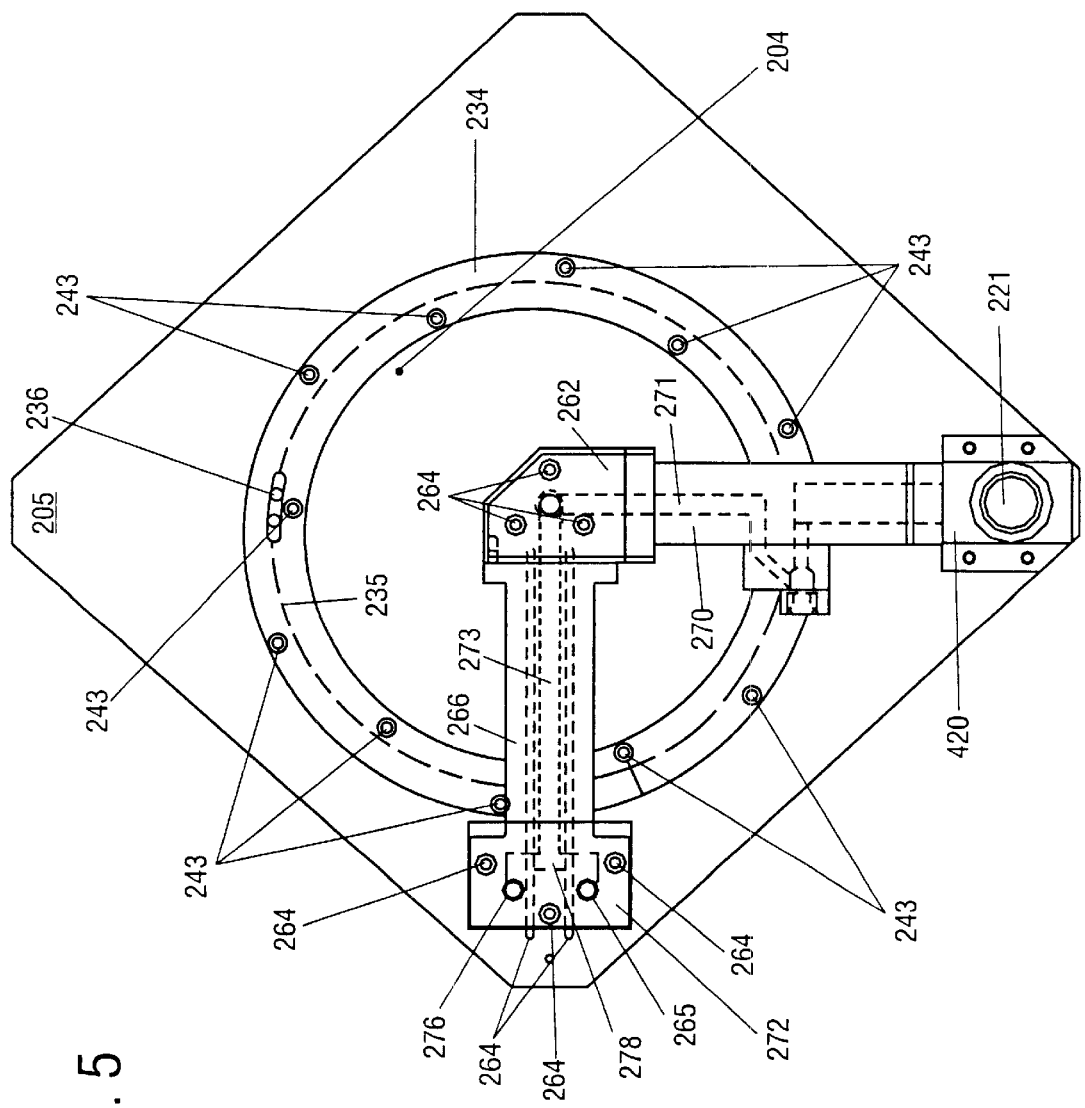
FIG. 5 is a top view of the lid of the present invention.

Referring now to FIG. 5 which is a top view of lid 205, the relationship of embedded heater 235 to other components mounted on lid 205 can be better appreciated. Embedded heater 235 is indicated in phantom and is located beneath backing plate 234. Backing plate 234 and fasteners 243 help increase the surface area contact between embedded heater 235 and lid 205 thereby improving the efficiency of heat transfer between heater 235 and lid 205. Lid 205 also has an embedded thermocouple 204 for monitoring the temperature within lid 205 in proximity to heater 235. Thermocouple 204 is part of a feedback control circuit which monitors and controls the power supplied to heater 235 to obtain a set point temperature within lid 205. Precise temperature control is desired in lid 205, as in all components in contact with vaporized precursor, in order to provide conditions which neither condense nor decompose low vapor pressure precursors such as TAT-DMAE and TAETO.

For a representative 200 mm embodiment of chamber 200 shown in FIG. 4, heater 235 could have a 650 W output rating and is commercially available from a variety of commercial sources such as Watlow, Inc. of Richmond, Ill. Temperature set-points between about 80° C. and 180° C. are readily obtained in lid 205 utilizing a heater 235 rated at about 650 Watts. It will be appreciate that various heater ratings, set-points and configurations could be utilized to obtain a wide range of temperature set-points depending upon the decomposition and condensation temperatures and other characteristics of the precursor material used. Although imbedded heater 235 is represented by a single, continuous, circular element, one of ordinary skill will appreciate that alternative embodiments wherein a plurality of continuous or discontinuous embedded heaters 235 are arranged within lid 205 to provide additional heat or greater temperature control within lid 205 are within the scope of the present invention.

Referring again to FIG. 4, heated lid 205 provides support for showerhead 240 and blocker plate 237. As such, showerhead 240 is attached to lid 205 via a plurality of evenly spaced fasteners 242 and blocker plate 237 is attached to lid 205 by a plurality of evenly spaced fasteners 217. Fasteners 217 and 242 are formed from a rigid material such as aluminum, varieties of nickel alloys and other materials having good thermal conductivity. Fasteners 242 and 217 provide clamping force which increases the contact area between heated lid 205 and the and the gas distribution components 237 and 240. Fasteners 242 and 217 have been advantageously placed to provide clamping force to increase contact between heated lid 205 and showerhead 240 in the case of fasteners 242 and heated lid 205 and blocker plate 237 in the case of fasteners 217. Increased contact area produces greater heat transfer between heated lid 205 and blocker plate 237 and showerhead 240.

Figure 6:
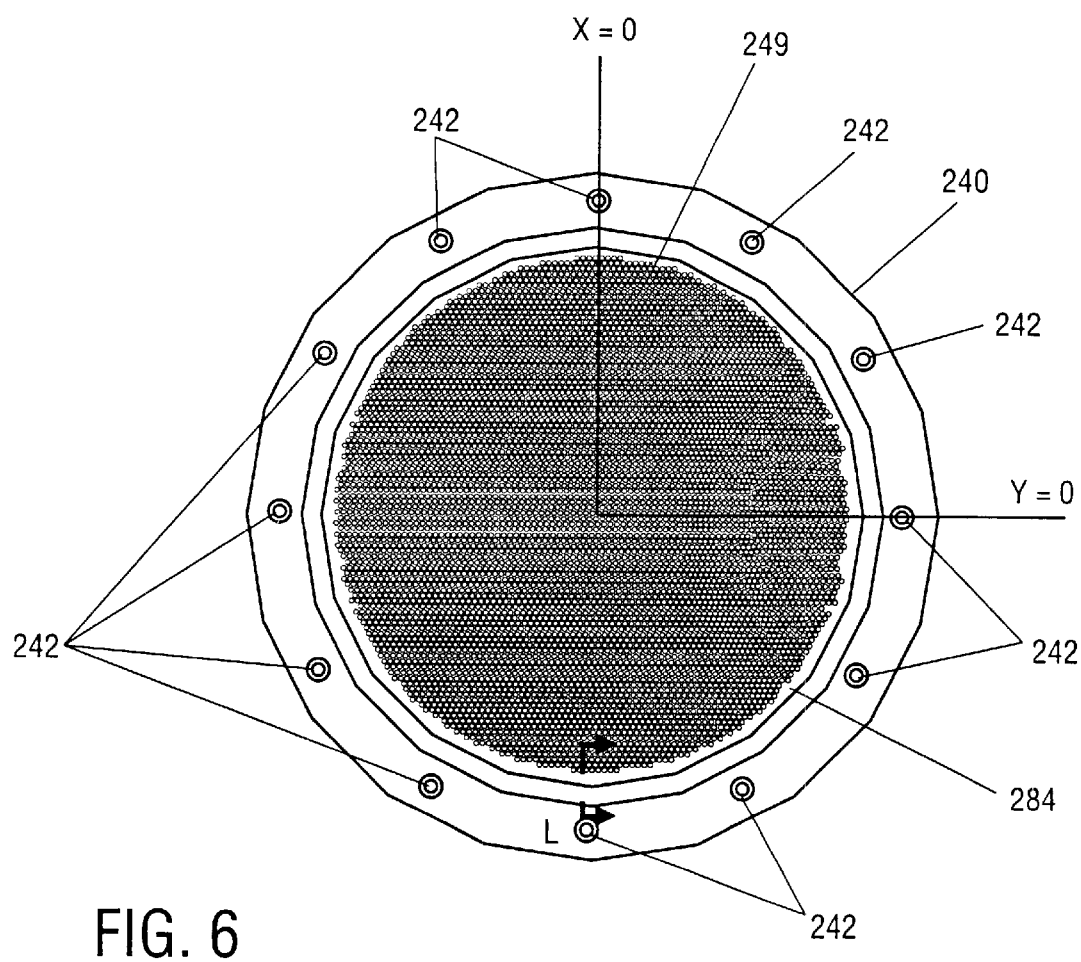
FIG. 6 is a top view of a showerhead having apertures 249.
Figure 7:
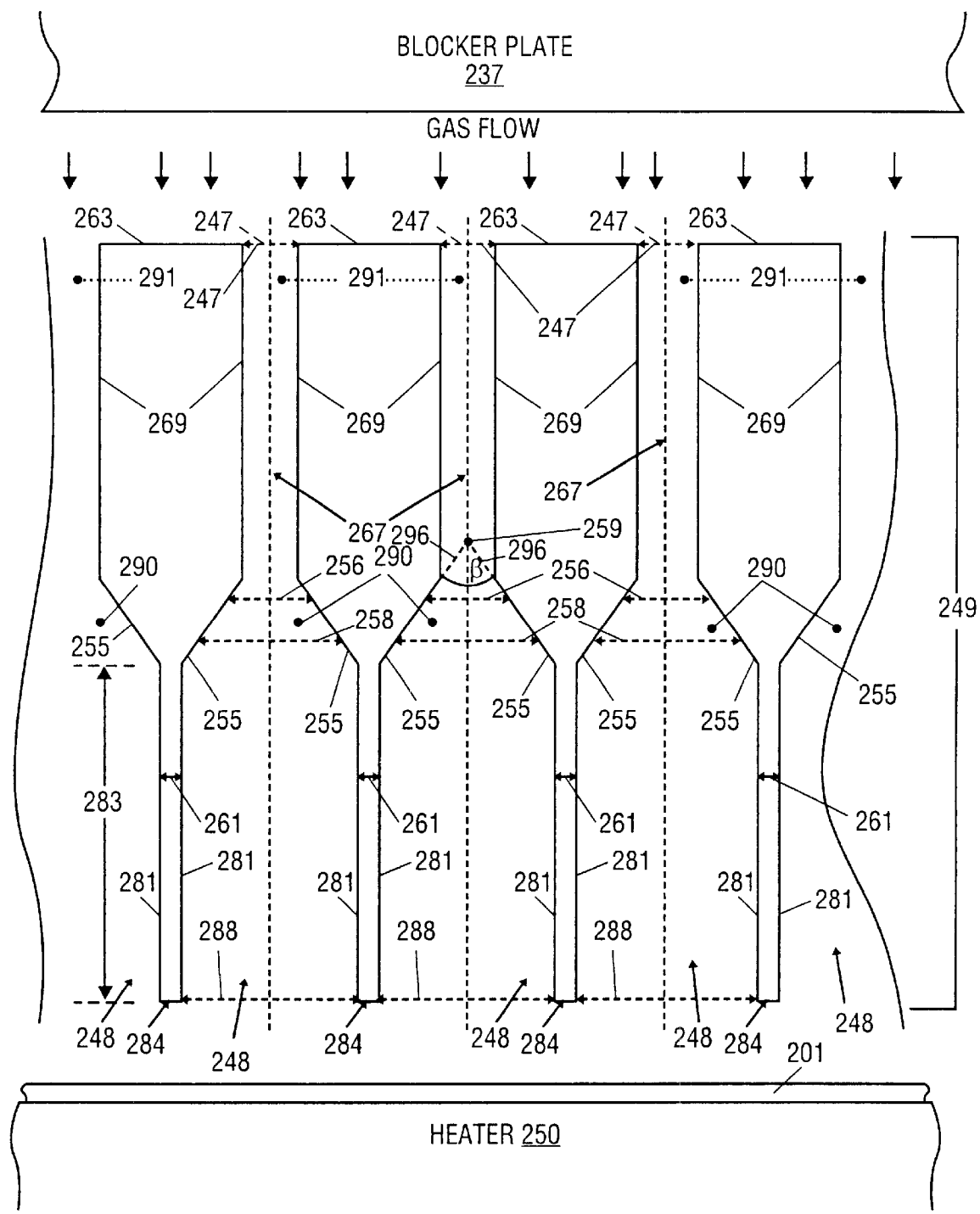
FIG. 7 is a sectional view of apertures 249.
Figure 8:
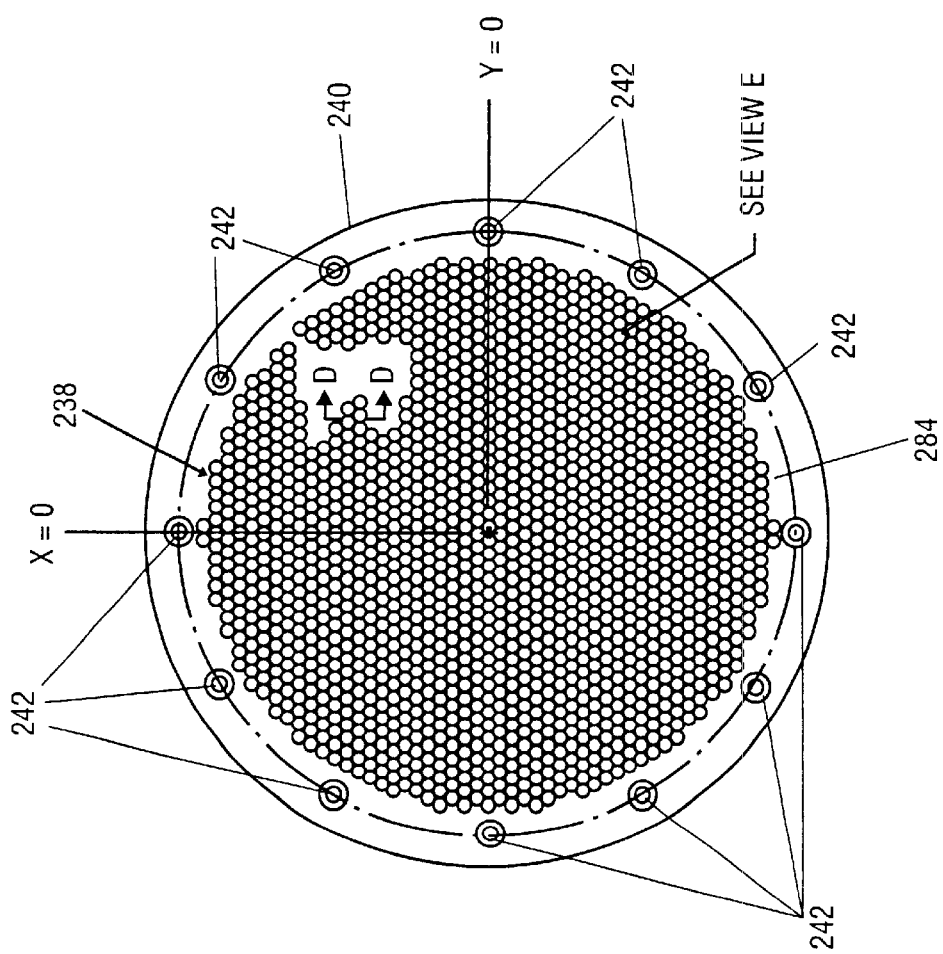
FIG. 8 is a top view of a showerhead having apertures 238.

Turning now to FIGS. 6, 7, 8, 9 and 13, the reduced reflection and increased absorption features of showerhead 240 of processing chamber 200 the present invention can be better appreciated. FIGS. 6 and 8 illustrate a plan views of showerhead lower surface 284 as viewed from a substrate 201 positioned on substrate support 250. Viewed from substrate 201 and looking towards lid 205 as in FIGS. 6 and 8 evenly spaced fasteners 242 are visible on the periphery of showerhead lower surface 284. Showerhead 240 also comprises a plurality of apertures 249 (FIG. 6) and 238 (FIG. 8) which allow gases and activated species to enter processing region 202.

Referring now to FIG. 7 the specific details and unique geometry of an aperture 249 can be better understood. FIG. 7 is a sectional view of an embodiment of a plurality of representative apertures 249 which is indicated as view L—L on FIG. 5. Aperture 249 includes an upper region 291, a conical region 290 and a lower region 248. A plurality of apertures 249 are distributed across showerhead 240 thereby allowing gases to flow from blocker plate 237 through aperture 249 to substrate 201. Gas from blocker plate 237 flows onto showerhead upper surface 263 and into inlets 291 of apertures 249. Inlet 291 is axially symmetric to aperture centerline 267 and could be cylindrically shaped with a diameter 247 of 0.028 inches. Inlet 291 is bounded by showerhead upper surface 263 and inlet parallel walls 269. Gas flows out of inlet 291 and into lower conical region 290 which is defined by divergent walls 255 which are axially symmetric to aperture centerline 267. For example, lower conic region 290 has an upstream diameter 256 measured between walls 255 which is smaller than a downstream lower conic region diameter 258. Extending divergent walls 255 to intersect at vertex 259, as indicated by dashed lines 296, angle β is formed. Angle β is axially symmetric to aperture centerline 267 such that vertex 259 is on and bisected by aperture centerline 267. Angle β is measured between divergent walls 255 and vertex 259. Thus, the angled surfaces of divergent walls 255 are presented to substrate 201.

From lower conic region 290 gas flows into outlet 248 which has parallel walls 281, a diameter 288 and is axially symmetric about centerline 267. Parallel walls 281 have a length 283 measured between the intersection of divergent walls 255 and parallel walls 281 and showerhead lower surface 284. Gas flowing out of outlet 248 flows towards substrate 201 within processing region 202.

The geometry and other specific aspects of aperture 249 are more clearly understood by describing the ratios between various aperture components. For example, inlet diameter 247 is less than outlet diameter 288 or inlet diameter 247 could be about one-third of outlet diameter 288 such as when a representative aperture 249 has an inlet diameter 247 of 0.028 inches and an outlet diameter 288 of 0.086 inches.

Another aspect of aperture 249 is the ratio between length 283 of outlet parallel walls 281 and outlet diameter 288 where length 283 is greater than diameter 288 or where length 283 is about 2.5 times outlet diameter 288. For example, a representative aperture 249 could have an outlet diameter 288 of about 0.086 inches and a length 283 of about 0.221 inches. Another aspect of aperture 249 is that length 283 of parallel walls 281 is greater than the length of divergent walls 255 or where parallel walls 281 are about 5.5 times as long as divergent walls 255. For example, the length 283 is about 0.221 inches and the length of divergent walls 255 is about 0.041 inches which results in a ratio of the length 283 of parallel walls 281 to the length of divergent walls 255 of about 5.39. Utilizing the ratios above, representative dimensions for each of a plurality of apertures 249 in a representative showerhead 240 fabricated from aluminum having a thickness of about 0.5 inches are: an inlet diameter 247 of about 0.028 inches; with inlet parallel walls 269 of about 0.25 inches; an outlet diameter 288 of about 0.086 inches with outlet parallel walls length 283 of about 0.221 inches.

Figure 9:
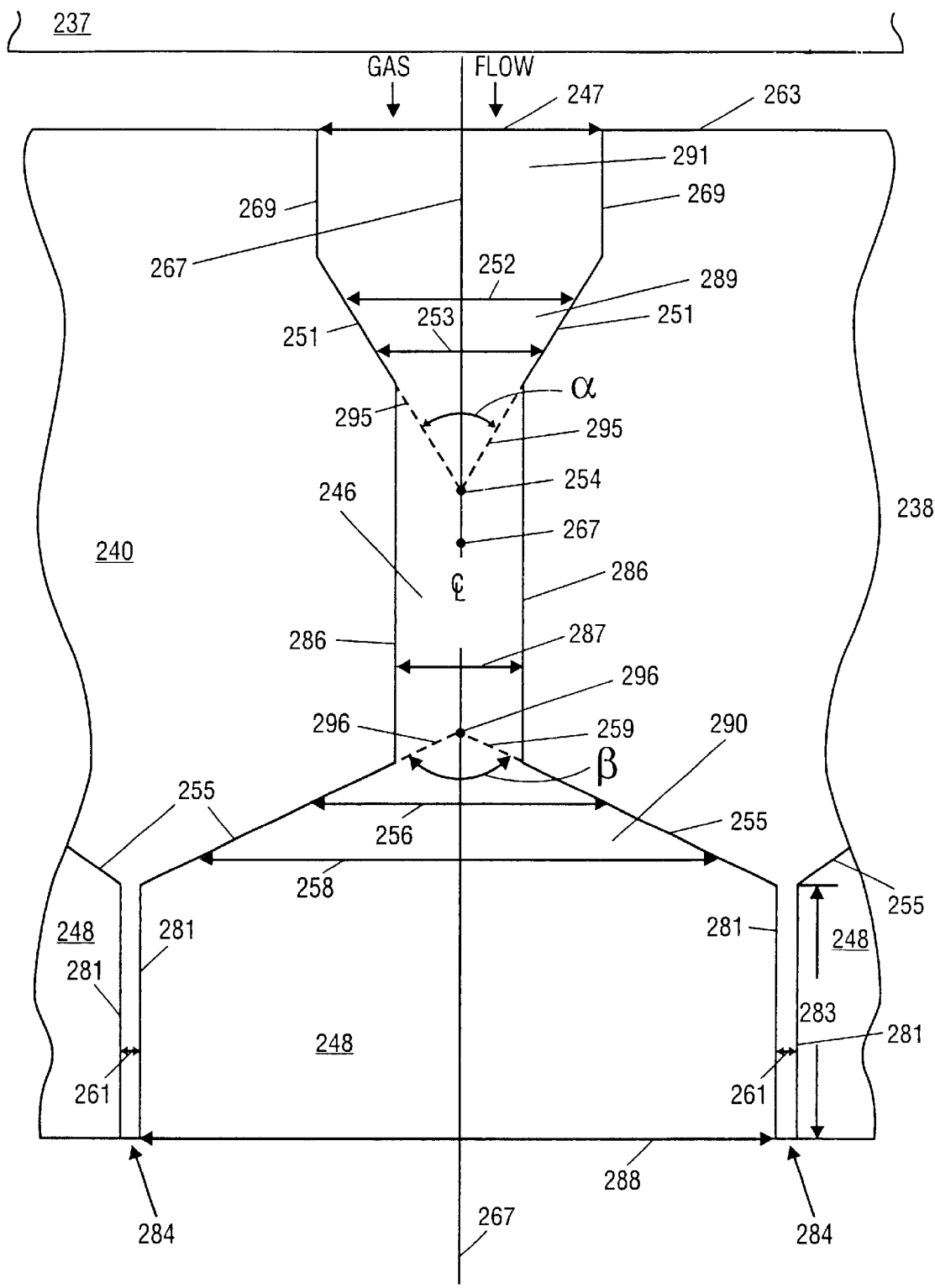
FIG. 9 is a sectional view of apertures 238.

Referring now to FIG. 9 the specific details and unique geometry of an alternative aperture embodiment, aperture 238, can be better understood. FIG. 9 is a sectional view of an embodiment of a single alternative aperture 238 indicated by view D—D on FIG. 8. A plurality of apertures 238, like aperture 249, are distributed across showerhead 240 thereby allowing gases to flow from blocker plate 237 through aperture 238 to substrate 201. Aperture 238 includes an upper region 291, an upper conical region 289, a central region 246, a lower conical region 290 and a lower region 248. Gas from blocker plate 237 flows onto showerhead upper surface 263 and into inlet 291. Inlet 291 is axially symmetric to aperture centerline 267 and could be cylindrically shaped with a diameter 247 of 0.110 inches. Inlet 291 is bounded by showerhead upper surface 263 and inlet parallel walls 269. Gas flows through inlet 291 into upper conic region 289 which is bounded by converging walls 251. Upper conic region 289 is axially symmetric to aperture centerline 267 and has a decreasing downstream diameter such that an upper conic region upstream diameter 252 is greater than an upper conic region downstream diameter 253. Converging walls 251, if extended to an intersection point as indicated by dashed lines 295, would intersect at vertex 254 forming an angle α. Angle α is axially symmetric to aperture centerline 267 such that vertex 254 is on aperture centerline 267 and angle α is bisected by aperture centerline 267. Angle α, measured between convergent walls 251 and vertex 254, is between about 25° and about 45°.

From upper conic region 289, gas flows into a central conduit 246 which is axially symmetric to aperture centerline 267. Central conduit 246 could be cylindrically shaped with a diameter 287 of about 0.028 inches. Central conduit 246 acts as a coupling conduit joining the upper conic region 289 and the lower conic region 290 thus allowing gas flow from inlet 291 to outlet 248. Gas flows from central conduit 246 into lower conical region 290 which is defined by divergent walls 255 and is axially symmetric to aperture centerline 267. For example, lower conic region 290 has an upstream diameter 256 between walls 255 which is smaller than a downstream lower conic region diameter 258. Divergent walls 255, if extended to an intersection point as indicated by dashed lines 296, would intersect at vertex 259 forming an angle β. Angle β is axially symmetric to aperture centerline 267 such that vertex 259 is on and bisected by aperture centerline 267. Angle β is measured between divergent walls 255 and vertex 259. The angled surfaces within showerhead 240 formed by divergent walls 255 are presented to substrate 201.

Gas flows from lower conic region 290 into outlet 248 which is axially symmetric about centerline 267. Outlet 248 could be cylindrically shaped having parallel walls 281 and a diameter 288. Parallel walls 281 have a length 283 measured between the intersection of divergent walls 255 and parallel walls 281 and showerhead lower surface 284. Gas flowing out of outlet 248 flows towards substrate 201 within processing region 202.

The geometry and other specific aspects of aperture 238 are more clearly understood by describing the ratios between various aperture components. One aspect of aperture 238 is that inlet diameter 247 is less than outlet diameter 288 or inlet diameter 247 is about one-half of outlet diameter 288. A representative aperture 238 could have an inlet diameter 247 of 0.110 inches and an outlet diameter 288 of 0.213 inches. Another aspect of aperture 238 is the ratio between the inlet 247 and outlet 288 diameters and the central region diameter 287 where central region diameter 287 is less than both inlet diameter 247 and outlet diameter 288. Central region diameter 287 is about 0.25 of inlet diameter 247 and about 0.13 of outlet diameter 288. For example, a representative aperture 238 could have an inlet diameter 247 of 0.110 inches, an outlet diameter 288 of 0.213 inches and a central region diameter of about 0.028 inches.

Another aspect of aperture 238 is the ratio between length 283 of outlet parallel walls 281 and outlet diameter 288 where length 283 is less than diameter 288. For example, length 283 is about three quarters or about 0.7633 of diameter 288, as in an outlet 248 having a length 283 of 0.1569 inches and a diameter 288 of 0.213 inches. Another aspect of aperture 238 is that the length 283 of parallel walls 281 is greater than the length of divergent walls 255 or where parallel walls 281 are about 1.5 times as long as divergent walls 255. For example, for the aperture 238 dimensions detailed above, the length 283 is about 0.1569 inches and the length of divergent walls 255 is about 0.1021 inches which results in a ratio of the length 283 of parallel walls 281 to the length of divergent walls 255 of about 1.53. Given the above ratios, dimensions for each of a plurality of representative apertures 238 in an aluminum showerhead 240 having a thickness of about 0.4 inches are: an inlet diameter 247 of about 0.110 inches; a central cylindrical region diameter 287 of about 0.028 inches with parallel walls 286 of about 0.080 inches; and an outlet diameter 288 of about 0.213 inches with outlet parallel walls 281 length 283 of about 0.1569 inches and divergent walls 255 of about 0.1021 inches. Although described as circular, the general shape of inlet 291, central conduit 246 and outlet 248 of an aperture 238 as well as the inlet 291 and outlet 248 of an apparatus 249 may also have various other shapes such as heptagonal, octagonal or other higher order polygons without departing from the scope of the present invention. It is to be appreciated that the above cited specific details with respect to aperture 238 and 249 are only representative embodiments of the unique aperture geometry of the present invention.

As mentioned above, in reaction rate limited processes, such as the deposition of tantalum pentaoxide or other transition metal dielectrics, one key factor for controlling deposition rate is the temperature of substrate 201. Thus, temperature variations which influence substrate 201 should be minimized to assist in obtaining more uniform deposition rates. One source of temperature variation occurs when radiant energy from substrate 201 and heated substrate support 250 reflects off showerhead 240 back to substrate 201. This redirected reflected energy is uncontrolled and asymmetric resulting in temperature variations within a single substrate 201 and in consecutively processed substrates 201. Showerhead lower surface 284 and divergent walls 255 of apertures 249 and 238 are reflected surfaces for radiant energy from substrate 201 and heated substrate support 250. Advantageously selecting the aperture geometry presented to substrate 201 is one method of increasing the emissivity of showerhead 240.

Figure 10:
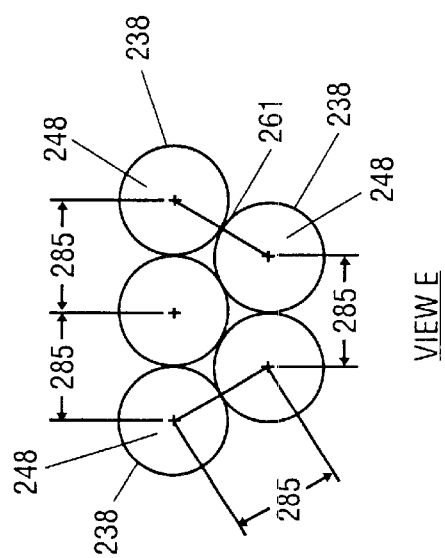
FIG. 10 is a plan view of the spacing between aperture outlets.

Two features of apertures 238 and 249 of the present invention which increase the emissivity of showerhead 240 are spacing 261 between apertures and the advantageous geometry of aperture outlets 248. The advantageous geometry of outlet 248 is discussed in detail below with respect to FIG. 13. Turning now to FIGS. 6 and 8 a plurality of apertures 249, shown in FIG. 6, and apertures 238, shown in FIG. 8, are evenly distributed across showerhead 240 resulting in a pattern of outlets 248 in showerhead lower surface 284. FIG. 10, which is an enlarged view E indicated on FIG. 8, represents the spatial relationship between adjacent outlets 248 regardless of aperture type. Outlets 248 are spaced across showerhead lower surface 284 such that the flat, reflective space between adjacent outlets 248 is minimized. The spacing between outlets 248, spacing 261, which represents the width of the flat reflective space between outlets 248 should be as small as possible. Another method of spacing outlets 248 across showerhead 240 lower surface 284 is to separate adjacent aperture centerlines 267 by some constant distance 285. Constant spacing distance 285 is selected based on outlet diameter 248 and desired spacing 261. For example, an aperture 238 having an outlet diameter 248 of 0.213 inches and a desired spacing 261 of 0.005 inches would have a centerline spacing 285 of 0.218 inches. In another example, an aperture 238 having an outlet diameter 248 of 0.086 inches and a desired spacing 261 of 0.012 inches would have a centerline spacing 285 of 0.098 inches.

As the number of apertures increases, spacing 261 decreases for a given size showerhead 240. This not only reduces the reflective surface between outlets 248 but also increases the amount of angled reflective surface created by divergent walls 255 of each aperture. In one respect, the distribution of apertures 249 and 238 can be viewed as replacing the flat, highly reflective surface between outlets 248 of lower showerhead surface 284 with divergent walls 255. Distributing apertures 249 and 238 by minimizing outlet spacing 261 increases the number and density of apertures 249 and 238 which correspondingly increases the number and density of divergent walls 255 presented to substrate 201. As the amount of divergent wall surface area increases, the probability that incident radiation onto showerhead 240 will be reflected and absorbed into showerhead 240 also increases.

Referring now to FIG. 11, a representative distribution of apertures 238 for a showerhead 240 sized to process 200 mm substrates can be better appreciated. FIG. 11 is a table listing representative aperture 238 locations using a coordinate system having X and Y axes similar to the system shown in FIG. 7 with an origin in the center of showerhead 240. FIG. 11 indicates ordinate and abscissa values for a first aperture 238 in a row of apertures 238 which form a representative distribution of apertures 238 having a minimized flat surface 261 between each aperture 238. Using FIG. 11 as a guide for the placement of each aperture 238 results in the distribution of about 1574 apertures 238 across showerhead 240. This distribution pattern is similar to the pattern of outlets 248 illustrated in FIG. 8. Referring now to FIG. 12, a distribution pattern for a plurality of apertures 249 can be better appreciated. FIG. 12 is a table listing representative aperture 249 locations using a coordinate system having X and Y axes similar to the system shown in FIG. 6 with an origin in the center of showerhead 240 used for processing 200 mm diameter substrates 201. FIG. 12 indicates ordinate and abscissa values for a first aperture 249 in a row of apertures 249 which form a representative distribution of apertures 249 having a minimized flat surface 261 between each aperture 249. Using FIG. 12 as a guide for the placement of each aperture 249 results in the distribution of about 6165 apertures 249 across showerhead 240. This distribution pattern is similar to the pattern of outlets 248 illustrated in FIG. 6.

Figure 13:
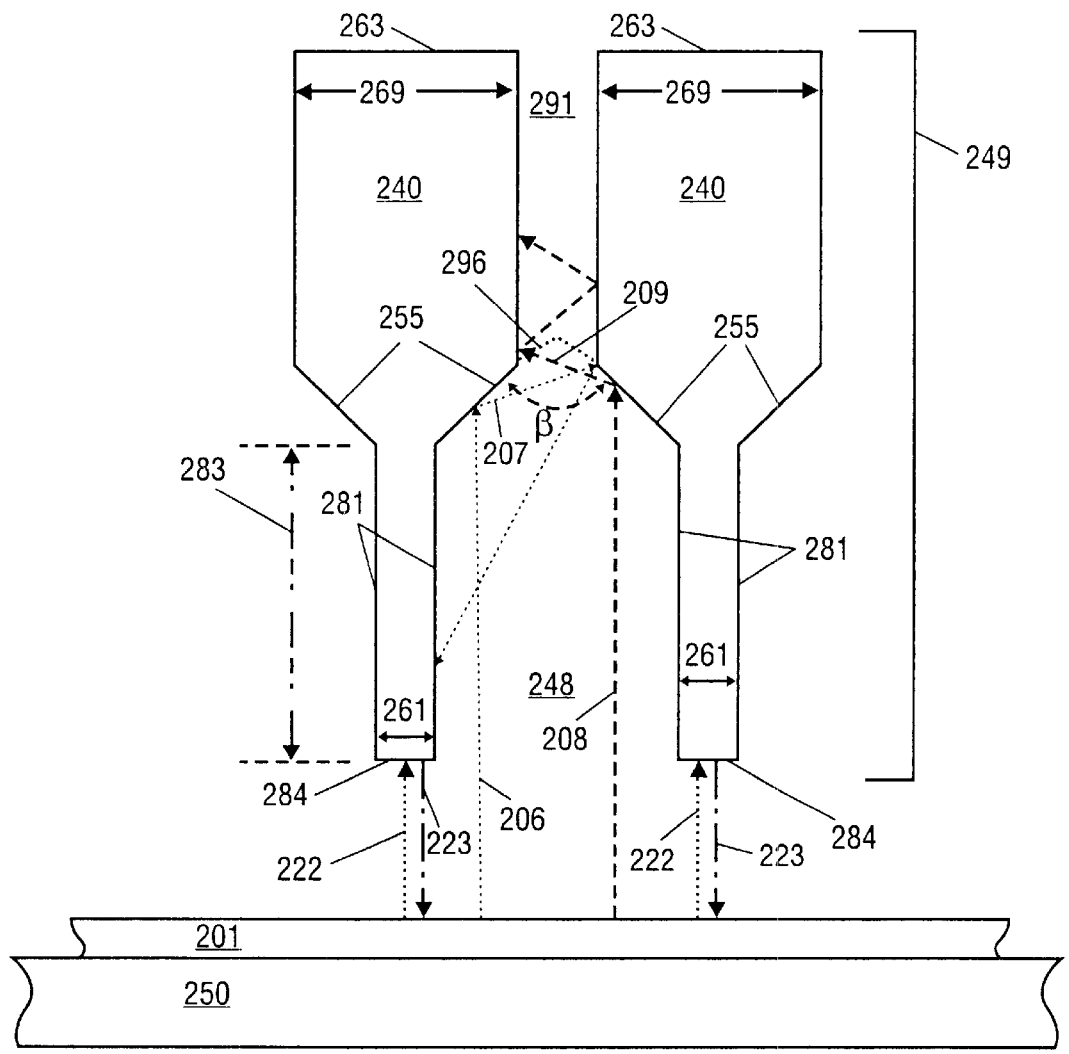
FIG. 13 is a sectional view of reflected and absorbed radiation within apertures of the present invention.

Turning now to FIG. 13, the novel reflective and absorptive characteristics of apertures 238 and 249 of the present invention can be better appreciated. Although FIG. 13 is a sectional view of an aperture according to aperture 249, the aspects of the present invention which follow also apply to aperture embodiment 238 as well as to other specific aperture embodiments made according to the present invention. In this aspect of the present invention, the specific geometric arrangement between divergent walls 255, angle β, parallel walls 281 and outlet diameter 288 is selected in order to increase the emissivity of showerhead 240. More specifically, by advantageously selecting an angle β, for example, outlet diameter 288 and length of parallel walls 281 can be selected such that radiation reflected off divergent walls 255 is absorbed into showerhead 240. The reflected radiation could then, for example, be absorbed into showerhead 240 through single reflections or multiple reflections with walls 281 or other aperture surfaces within showerhead 240.

The minimized spacing between adjacent outlets feature aspect of showerhead 240 of the present invention is also illustrated in FIG. 13. Radiation 222 represents that radiation normal to showerhead lower surface 284. When normal radiation 222 intersects the generally flat, highly reflective surface 284, the result is normal reflected radiation 223. It will be appreciated therefore, that as aperture spacing 261 decreases, more normal radiation 222 will be incident onto divergent walls 255 and the highly absorptive geometry of apertures 238 or apertures 249.

In another aspect of the present invention, the relationship between divergent walls 255 and outlet walls 281 is utilized to facilitate absorption of reflected radiation into showerhead 240. Divergent walls 255 and the angle β between them provide a reflective surface to representative incident radiation 206 and 208. For example, incident radiation 208 intersects divergent wall 255. A portion of radiation 208 will be absorbed by wall 255 and a portion will be reflected as radiation 209. Because of the angled presentation of divergent wall 255, reflected radiation 209 intersects wall 269. A portion of radiation 209 is absorbed in the first intersection and a portion is reflected. This process of absorption and reflection continues as reflected radiation 209 is reflected and absorbed by walls 269. In another example, incident radiation 206 intersects divergent wall 255 and a portion of radiation 206 is absorbed by wall 255. A portion of radiation 206 is reflected by wall 255 forming reflected radiation 207. As a result of the selection of angle β, reflected radiation 207 crosses lower region 248 and intersects an adjacent divergent wall 255. In the second intersection, a portion of radiation 207 is absorbed by wall 255 and a portion is reflected. FIG. 13 illustrates an aperture configuration where radiation 206—i.e. radiation reflected into lower region 248—is absorbed into walls 281. It is to be appreciated that angle β, length 283 and diameter 288 could be selected such that radiation reflected into the lower region 248 would have multiple refection and absorption reactions with walls 281 and 255. By advantageously selecting the outlet diameter, angle β, and the length of walls 281, apertures according to the present invention will first reflect radiation using divergent walls 255 then absorb radiation via parallel walls 281 thereby reducing reflective radiation produced by showerhead 240. In order to absorb reflected radiant energy, such as reflected energy 207, walls 281 are generally between about 1.5 and 5.5 times the length of divergent walls 255 for a given angle β. For a representative aperture 249 located within a showerhead 240 having a thickness of about 0.5 inches and an angle β of about 90°, divergent walls 255 are about 0.041 inches while walls 281 are about 0.221 inches. In a representative aperture 248 located within a showerhead 240 having a thickness of about 0.4 inches and an angle β of about 130°, divergent walls 255 are about 0.1021 inches while walls 281 are about 0.1569 inches. One of ordinary skill in the art will appreciate that numerous showerhead thicknesses, outlet diameters 288, lengths of walls 281 and angles β may be combined to provide a varieties of aperture geometry capable of absorbing incident radiation according to the methods of the present invention.

In another aspect of the present invention, the emissivity (∈) of the surface of showerhead 240 is intended to be as high as possible in order to approximate the emissivity of a black body. An object of the present invention is to provide showerhead 240 emissivity in the range of about 0.6 to about 0.9. Those of ordinary skill in the art will appreciate that a variety of surface finishing techniques, such as anodization, oxidation, ceramic coating or bead blasting may be employed to obtain the desired emissivity. Film accumulation on showerhead 240 occurs during sequential deposition processes within processing region 240. A showerhead with film deposits absorbs more incident radiation than a showerhead without those accumulations. The resulting absorption variation and temperature difference film accumulation causes is a source of thickness uniformity variation between consecutively processed wafers. For purposes of illustration, suppose the resulting accumulation of film causes an average emissivity change ($\in_{ch}$) of 0.05 in showerhead 240. For reaction rate limited processes—which rely on temperature—such a seemingly minor variation in emissivity can result in wafer-to-wafer temperature variations which can in turn result in deposition rate and thickness non-uniformities between wafers processed in the same chamber. For example, a showerhead having a unpolished metal surface may have an emissivity ($\in_{um}$) of about 0.4. As a result of processing several wafers, $\in_{um}$ could have been increased by $\in_{ch}$ or 0.05 to 0.45 representing a 12.5% change in emissivity. Even if oxidized metals with an emissivity ($\in_{om}$) of about 0.45 are used, the emissivity change resulting from the same amount of film deposition—an 0.05 increase in emissivity—results in an emissivity change of 11.1%. Not until highly oxidized metals ($\in \approx 0.7$) or even anodized surfaces ($\in \approx 0.9$) are employed does the impact of representative emissivity change $\in_{ch}$ produce emissivity variation below 10%. Utilizing a showerhead 240 with a higher initial emissivity reduces the impact of later emissivity varying events such as the accumulation of film on showerhead 240. An object of the present invention is to increase the absorptive characteristics or emissivity of showerhead 240 such that the emissivity 20 variation induced by film accumulation is reduced or, in other words, the emissivity of showerhead 240 is sufficiently high that it could be said to be invariant. For example, a showerhead 240 having an emissivity above about 0.6 or a sufficiently high emissivity such as between 0.7 and 0.9 which changes by less than 10% after repeated exposure to processing environments like those found in processing region 202.

Another object of the present invention is to reduce the temperature variations from one substrate 201 to another in a continuously running reactor as in, for example, reactors utilized in reaction rate limited processes such as the deposition of tantalum pentaoxide. Either of the emissivity increasing methods described above (i.e., modification of showerhead surface or selecting highly absorptive aperture geometry) can be employed alone or in combination to increase the emissivity of showerhead 240 and thereby reduce temperature variations. First, reflective surfaces on lower showerhead surface 284 have been minimized by adjusting the spacing 261 between outlets 248. Minimizing the spacing 261 between outlets 248 effectively substitutes the divergent walls 255 of apertures 238 and 249 in the place of flat, highly reflective surfaces. Second, the divergent walls 255 and shape of lower conic region 290 in conjunction with parallel walls 281 of each of the plurality of apertures 238, or alternatively 249, result in reflective radiation patterns which will likely be absorbed by showerhead 240 instead of reflected back to substrate 201. Third, the emissivity of the material forming showerhead 240 has been modified resulting in a is sufficiently high emissivity such that emissivity varying events, such as the accumulation of deposits during substrate processing, result in an over all emissivity change of less than 10%. The showerhead emissivity could be said to be invariant since emissivity change as a result of wafer processing operations within processing region 202 is slight or less than 10% of total emissivity. As a result, sequentially processed wafers are exposed to a more similar processing environment since the emissivity of a showerhead of the present invention is nearly constant or invariant between consecutive wafers.

The elevated temperature of showerhead 240 which results from increased absorption of radiation provides several advantages to chamber 200. As mentioned above, the elevated temperature achieved in showerhead 240 can reduce or completely prevent undesirous vapor condensation which may likely occur or occur at a greater rate at lower showerhead temperatures. Another advantage is that as the temperature of showerhead 240 increases, the temperature difference between showerhead 240 and substrate 201 decreases. As the temperature difference decreases, the rate of heat transfer between the substrate and the showerhead also decreases. Controlling or minimizing heat losses from substrate 201 is critically important in reaction rate limited processes, such as the formation of Tantalum oxide which is an object of processing system 100 of the present invention. The rate of heat loss from substrate 201 impacts the deposition temperature which is one influential factor for controlling deposition rate and thickness uniformity of films formed on substrate 201. Therefore, decreasing the rate of heat transfer from substrate 201 to showerhead 240 reduces a source of deposition rate and thickness variation.

Figure 14:
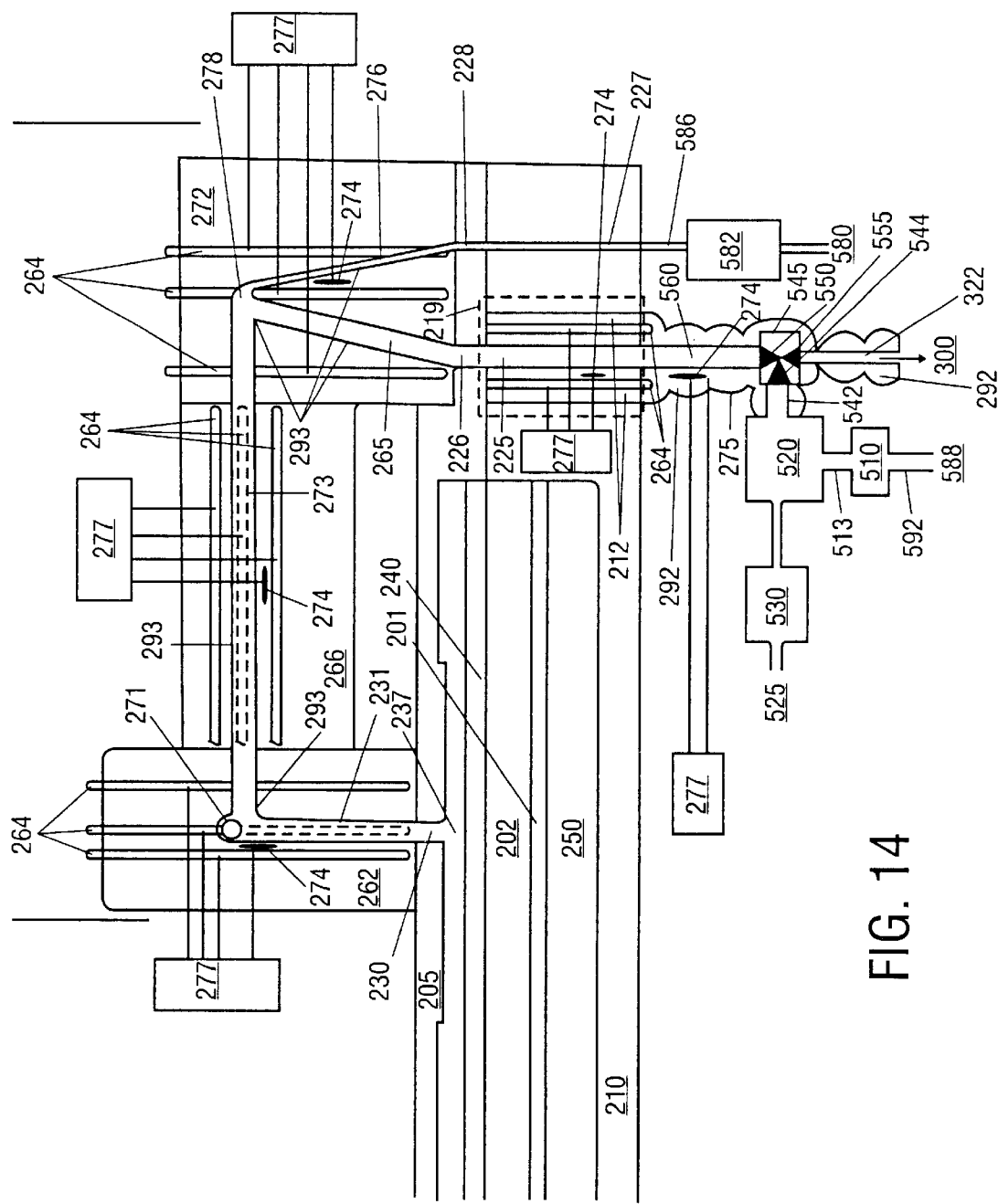
FIG. 14 is a sectional view of gas delivery lines within a heated gas feed through assembly of the present invention.

Referring now to FIG. 14 which is a cross section of chamber 200 and schematic portions of vapor delivery system 500, specific aspects of the temperature controlled conduits feature of chamber 200 of the present invention can more fully appreciated. Also shown is one feature of the vapor delivery system of the present invention illustrating the continuous, independent temperature controlled conduits which couple the outlet of vaporizer 520 with processing region 202. Given the low vapor pressure of the Tantalum precursor, another feature of the vapor delivery system is the shortened vapor flow path from vaporizer 520 to processing region 202. By shortening the precursor vapor flow path, pumping losses, friction losses and other fluid dynamic inefficiencies associated with the length of the pumping conduit as well as the inherent difficulties of pumping low vapor pressure gases can be reduced. The reduction of the above fluid losses is beneficial to the effective vaporization and delivery of low vapor pressure precursors according to the present invention. As a result of minimizing the precursor flow path, the vapor delivery system of the present invention is able to attain more stable and repeatable vapor flow rates for low vapor pressure precursors.

Inlet and mixing block 272, mixed deposition gas feed through block 266 and central mixing block 262, collectively referred to as heated gas feed through 220, are formed from rigid materials such as aluminum, varieties of nickel alloys or other materials having good thermal conductivity. The various conduits formed within heated gas feed through assembly 220 couple the outlets of heated chamber feed through 225 and process gas feed through 227 and lid bore throughs 226 and 228 to central chamber bore through 230.

Inlet and mixing block 272 attaches to lid 205 forming a sealed, continuous flow path between precursor lid bore-through 226 and precursor inlet conduit 265 and between process gas lid bore-through 228 and process gas inlet conduit 276. Typically o-rings formed of Chemraz® or Kalrez® are used at lid bore-through outlets 226 and 228 to provide a seal at the mating surfaces between lid 205 and inlet and mixing block 272. Mixing manifold 278 merges the process gas and precursor vapor flows into a single gas flow and begins the process of mixing precursor and process gas or gases into a homogeneous mixture for delivery into processing region 202. The length of conduit from the point within mixing manifold 278 where the precursor vapor stream and the process gas stream mix is sufficiently long such that the resulting mixed gas stream is homogeneously mixed upon arrival in processing region 202. Although specific lengths to achieve homogeneous mixing will vary depending on a variety of factors such as the diameter of the conduit and gas flow rates and temperatures, a representative length from mixing manifold 278 to processing region 202 would be about 12 inches for a 0.5 inch inner diameter mixed deposition gas conduit 273, central conduit 231 and bore through 230 of FIG. 14. In an alternative example, the length of conduit which could also result in homogeneous mixing of precursor vapor and process gases from mixing manifold 278 through mixed deposition gas conduit 273 and central conduit 231, both having inner diameters of 0.5 inches, is about 10 inches.

Inlet and mixing block 272 attaches to mixed deposition gas feed-through block 266 such that the outlet of mixing manifold 278 is coupled to mixed deposition gas conduit 273 formed within mixed deposition feed-through block 266. Typically the mating surface surrounding the conduit outlet of conduit 278 and the inlet of mixed deposition gas conduit 273 is similarly sealed with an o-ring formed of Kalrez® or Chemraz®. Mixed deposition gas feed-through block 266 attaches to mixing block 262 and similarly forms an o-ring sealed conduit between mixed deposition gas conduit 273 and central gas feed-through conduit 231. Mixing block 262 is attached to heated lid 205 forming an o-ring sealed conduit between central gas feed-through conduit 231 and central lid bore-through 230. In order to more clearly describe the unique temperature controlled conduits feature of chamber 220 of the present invention, inlet mixing block 272 and mixed deposition gas feed through block 266 are described and discussed as separate pieces. However, one of ordinary skill in the art will appreciate that a single workpiece could be utilized having the described dimensions and characteristics of both inlet mixing block 272 and mixed gas feed through 266 without departing from the scope of the present invention.

The temperature of each of the conduits formed internal to heated manifold 220 (265, 276, 278, 273 and 231) are controlled by a plurality of independent heaters 264, thermocouple 274 and controller 277 units. One unit controls the temperature of conduits 265, 276 and 278 within inlet and mixing block 272; another controls the temperature of conduit 273 within feed through block 266; and another controls the temperature of conduit 231 within central block 262. In each block, a plurality of cartridge or fire-rod type heaters 264 are advantageously arranged integral to the given block in proximity to the conduit or conduits within a given block. Multiple heaters provide the most efficient heating of the particular conduit or conduits within a given block as the heaters can be located based upon the size, shape, composition and thermal conductivity of the particular block as well as the particular geometry of the conduits. For the representative system illustrated in FIG. 14, cartridge heaters 264 are about 0.25 inches in diameter, cylindrical in shape, have various lengths, output power capacities and are available commercially from Watlow Inc. of Richmond, Ill. under the brand name "Firerod".

The set-point temperature is maintained within a given conduit by inputting a desired temperature set-point into the controller 277 for the particular conduit. Controller 277 could be a PID type controller similar to Model 965 which is also commercially available from Watlow, Inc. Thermocouples 274 are embedded within gas feed through assembly 220 in proximity to each conduit such that the temperature registered by each thermocouple 274 is approximately the same as the temperature within the gas conduit by which the thermocouple is installed. The position of thermocouple 274 relative to a given gas conduit varies depending upon a number of factors such as the thermal conductivity of the material used to fabricate the given block and the type of thermocouple 274 used. The signal from thermocouple 274 is sent to controller 277 which compares the temperature from thermocouple 274 to the input temperature set-point. Based on the result of comparing the temperature from thermocouple 274 to the input temperature set-point, controller 277 will either increase, decrease or maintain power supplied to cartridge heaters 264. One advantage of utilizing a plurality of independent thermocouples 274 is that the specific conditions of a given conduit block are taken into account depending upon its location relative to other heat sources such as heated lid 205, heat loses and geometry.

For example, inlet and mixing feed through block 272 is in direct contact with heated lid 205 and, unless the temperatures between them exactly match, will either gain energy from or lose energy to lid 205. The effect of heat transfer between lid 205 and mixing feed through block 272 on the temperature of conduits 265, 276 and 278 within block 272 will be reflected in the temperature detected by a thermocouple 274 located within block 272. As a result, the controller 277 associated with block 272 can increase or decrease the power output of heaters 264 embedded within block 272 in proximity to conduits 265, 276 and 278 to compensate for heat transfer between block 272 and lid 205. In much the same way, energy transfer between mixing block 262 and lid 205 is compensated for by the thermocouple, heater, controller unit associated with block 262. Similarly, heat losses of mixed deposition gas feed through block 266 which are different from heat transfer of blocks 272 and 262 since it has a higher potential for heat loss because it is not in direct contact with heated lid 205 and has a larger surface area exposed to the ambient conditions (about 70 degrees Fahrenheit) within the wafer fabrication facility when protective cover 203 is removed. However, when protective cover 203 is in place as illustrated in FIG. 2, temperatures surrounding manifold 220 are increased to about 70 to 80 degrees Celsius. Thus, the heater, thermocouple, controller unit dedicated to mixed deposition gas feed-through block 266 is utilized to compensate for the particular heat transfer characteristics of that block.

More generally, an aspect of the present invention is a method to provide a predetermined temperature set-point within a conduit by the selection, placement and use of a controller, heater and thermocouple control unit which utilizes the method and apparatus described above. Another feature of the multiple, independent cartridge heater, thermocouple and controller units of the present invention is that a uniform conduit temperature throughout heated gas manifold 220 can be achieved. Because of their independence, each controller is able to efficiently maintain set points irrespective of conditions in surrounding blocks while taking into account the specific heat losses and conditions surrounding each block, the specific outer shapes of each block and the geometry of the conduits formed within each block. In another aspect of the present invention, the temperature set point of each conduit could be set and maintained to induce a negative temperature gradient where the temperature of block 262 is less than block 266 which is less than the temperature of block 272. Alternatively, a positive temperature gradient could be induced where the temperature in block 272 is less than the temperature in block 266 which is also less than the temperature of block 262.

In a specific embodiment of the apparatus of chamber 200 of the present invention, mixed deposition and feed-through block 266 is an aluminum rectangle with the following dimensions: about 5 inches long, about 1.5 inches wide and about 0.7 inches high. For the aluminum mixed deposition feed through block 266 described above, a representative cartridge heater 264 could be cylindrically shaped, 0.25 inches in diameter, 5.5 inches long with a power output capacity of 500 Watts. In an embodiment of the method and apparatus of the present invention, a single cartridge heater 264 or a plurality of heaters 264 of a selected power output capacity of about 500 Watts could be employed within mixed deposition feed through block 266 such that the temperature within mixed deposition gas conduit 273 remains above the vaporization temperature and below the decomposition temperature of the carrier gas/precursor vapor/process gas mixture flowing within conduit 273. In a specific embodiment where mixed deposition gas feed through block 266 is as described above, a thermocouple 274 could be placed between about 0.125 inches to 0.5 inches away from mixed deposition gas conduit 273. In an embodiment of the present invention where the carrier gas/precursor vapor/process gas mixture within conduit 273 is comprised of a Tantalum precursor such as TAT-DMAE, a process gas such as oxygen, and a carrier gas such as nitrogen, conduit 273 temperatures between about 130° C. and 160° C. would prevent both condensation and decomposition of the tantalum/oxygen/nitrogen mixture. Thus, using the TAT-DMAE example above, a typical set-point temperature could be about 150° C. or between about 130° C. and 160° C. Representative set-points for an embodiment of the present invention employing TAETO could be about 170° C. or between about 150° C. and 180° C.

A further aspect of the temperature controlled conduits of chamber 200 of the present invention provides temperature controlled delivery of vaporized precursor from vaporizer 520 to lid bore through 230. Vaporized precursor exits vaporizer 520 via vaporizer outlet 540 and enters vaporizer outlet line 542 which is coupled to precursor inlet 544 of chamber by-pass valve 545. When three-way valve 545 is aligned to chamber, precursor vapor exits three way valve 545 via chamber outlet 550 flowing then to precursor chamber supply line 560 which is coupled to precursor feed through 225. A jacket type temperature controlled conduit 292 is created between the outlet of vaporizer 520 and the inlet to precursor feed through 225 and encompasses conduits 542 and 560 and three way valve 545. A jacket type control unit comprises a jacket or wrap style heater 275, a controller 277 and a thermocouple 274 is utilized to maintain a temperature set-point in the above components 542, 560 and 545. From temperature controlled precursor feed through 225, precursor vapor flows through lid bore through 226 into precursor inlet conduit 265 of inlet and mixing block 272. From precursor inlet 265, the precursor vapor flows into mixing manifold 278 where it mixes with process and ballast gases supplied via process inlet conduit 276.

The temperature of precursor vapor within conduit 225 is maintained by the temperature controlled chamber feed through 219 which includes a plurality of cartridge type heaters 264, a thermocouple 274 and a controller 277. Another feature of temperature controlled precursor feed through 219 is thermal choke or air gap 212 which insulates thermal influences of chamber body 210 from the components of temperature controlled precursor feed through 219.

Thus, by utilizing the plurality of heater, controllers and thermocouples described above and the features of heated lid 205, chamber 200 and liquid delivery system 500 provide a temperature controlled flow path for vaporized low vapor pressure precursors from origin in vaporizer 520 to use in processing region 202.

Process gas heat exchanger 582 provides temperature control to process gas and ballast gases for use in chamber 200. Process gas heat exchanger 582 is located proximate to chamber body 210 and, more specifically, to process gas chamber feed through 227 such that the gas temperature exiting heat exchanger 582 is approximately the same as the gas temperature entering feed through 227. From process gas feed through 227, temperature controlled process and ballast gases pass through lid bore through 228 and enter process gas inlet 276 of inlet and mixing block 272.

Another aspect of the present invention is the use of process gas heat exchanger 582 to heat process and ballast gases above the temperature of the vaporized precursor gas stream. As a result, when the heated process gas stream and the vaporized precursor gas stream intersect and mix within mixing conduit 278 the risk of condensation of the vaporized precursor is virtually eliminated. For example, the temperature set-point of process gas heat exchanger could be about 5–10° C. above the temperature set-point of vaporizer 520. In much the same way, the temperature of process gas and ballast gas can be controlled to remain below a set-point where, upon mixing with the precursor vapor stream, decomposition of the precursor occurs. Alternatively, a set-point could be utilized which results in process gas temperatures at least as high as the merging precursor gas stream.

Utilizing the above described independent thermocouple, controller, heater sets which are part of processing system 200 and vapor delivery system 500, a series of temperature controlled conduits is provided which can deliver vaporized low vapor pressure precursors from the outlet of vaporizer 520 to processing region 202. Although temperature controlled conduits based on heater type are described—cartridge heater temperature controlled conduits 293 and jacket or wrap style heater type temperature controlled conduits 275—their description is not intended to be limiting as one of ordinary skill in the art will appreciate that a variety of heater types, thermocouples and controllers could be utilized without departing from the scope of the present invention. The independent temperature controlled conduits feature of the present invention provides more precise means of temperature control than previously available but also allows for vaporized liquid delivery under a variety of thermal conditions which exist as a result of the environment to which each conduit is exposed. For example, each temperature controlled conduit could be set to maintain a set-point 2–3° C. hotter than the previous conduit so that a slightly positive thermal gradient is maintained between the vaporizer 520 and outlet of central conduit 231 into processing region 202 or, more generally, an overall ΔT could be maintained between the vaporizer outlet temperature and the temperature in central conduit 231 or a ΔT of about 20–25° C.

Another aspect of the thermally controlled conduits of processing chamber 200 and vapor delivery system 500 of the present invention is that the conduits used downstream of vaporizer 520 in the precursor flow path, as shown in FIG. 14 between vaporizer 520 and central lid bore through 205, have progressively larger diameters which result in increasing cross-sectional flow areas resulting in an expanded gas flow volume within these conduits. The volume expansion and corresponding pressure drop within the precursor delivery conduits further help maintain conduit conditions which neither condense nor decompose the vaporized precursor. Another aspect of the independent temperature controlled conduits of chamber 200 is that temperature changes within a specific conduit associated with the volume expansion can be compensated for by the independent heater, controller and thermocouple of that particular conduit. For example, representative inner diameters for the chamber illustrated in FIG. 14, are a vaporizer outlet 542 with an inner diameter of 0.18 inches, a precursor supply line 560, chamber feed through 225 and inlet 265 with inner diameters of 0.40 inches and a mixed deposition gas conduit 278 and central conduit 231 with inner diameters of about 0.5 inches. Another aspect of the present invention is that the cross sectional area of downstream of the intersection of the precursor gas flow and the process gas flow is larger than the sum of the merging gas flows. This relationship ensures that the downstream volume is larger thereby providing the increasing flow volume/decreasing precursor pressure feature discussed above. Additionally, the diameter of mixed deposition precursor conduit 273 is also greater than either precursor inlet 265 or process gas inlet 276.

The increased volume and correspondingly decreased pressure achieved by advantageously selecting the diameter of conduits downstream of vaporizer 520 such as 542, 560, 225, 226, 265, 278, 273 and 231 in conjunction with the temperature control provided by the thermocouple, heater and controller sets described above provide a controlled temperature and pressure regime between vaporizer 520 and processing region 202 such that very low vapor pressure precursors, such as and including Tantalum precursors like TAETO, TAT-DMAE or other similarly low vapor pressure precursors, dopants or other processing materials may be delivered to processing area 202 without undesired condensation or decomposition.

The Remote Plasma Generator

Figure 15:
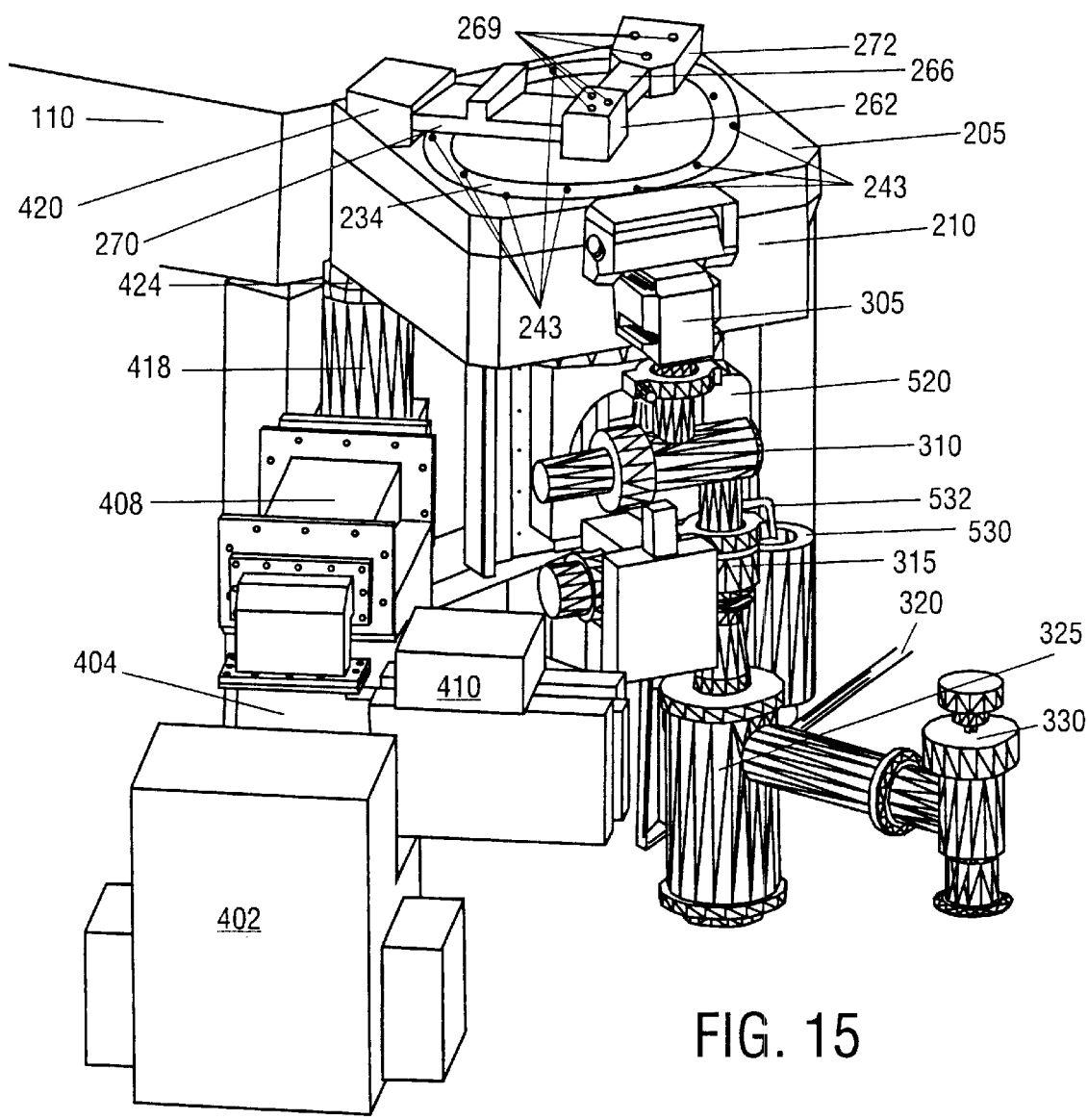
FIG. 15 is a perspective view of an embodiment of the exhaust system and remote plasma generator of the present invention.

Another aspect of the processing apparatus 100 of the present invention is remote plasma apparatus 400 shown FIG. 15 in relation to central substrate transfer chamber 110 and chamber 200 and components of heated exhaust system 300. Remote plasma apparatus 400 creates a plasma outside of or remote to processing region 202 for cleaning, deposition, annealing or other processes within processing region 202. One advantage of a remote plasma generator 400 is that the generated plasma or activated species created by remote plasma generator 400 may be used for cleaning or process applications within the processing region without subjecting internal chamber components such as substrate support 250 or shower head 240 to plasma attack which usually results when conventional RF energy is applied within process region 202 to create a plasma. Several components of remote plasma apparatus 400 are visible in FIG. 15 such as magnetron 402, auto tuner controller 410, isolator 404, auto tuner 408, adapter tube 418 and adapter tube heat insulation disc 424.

Figure 16:
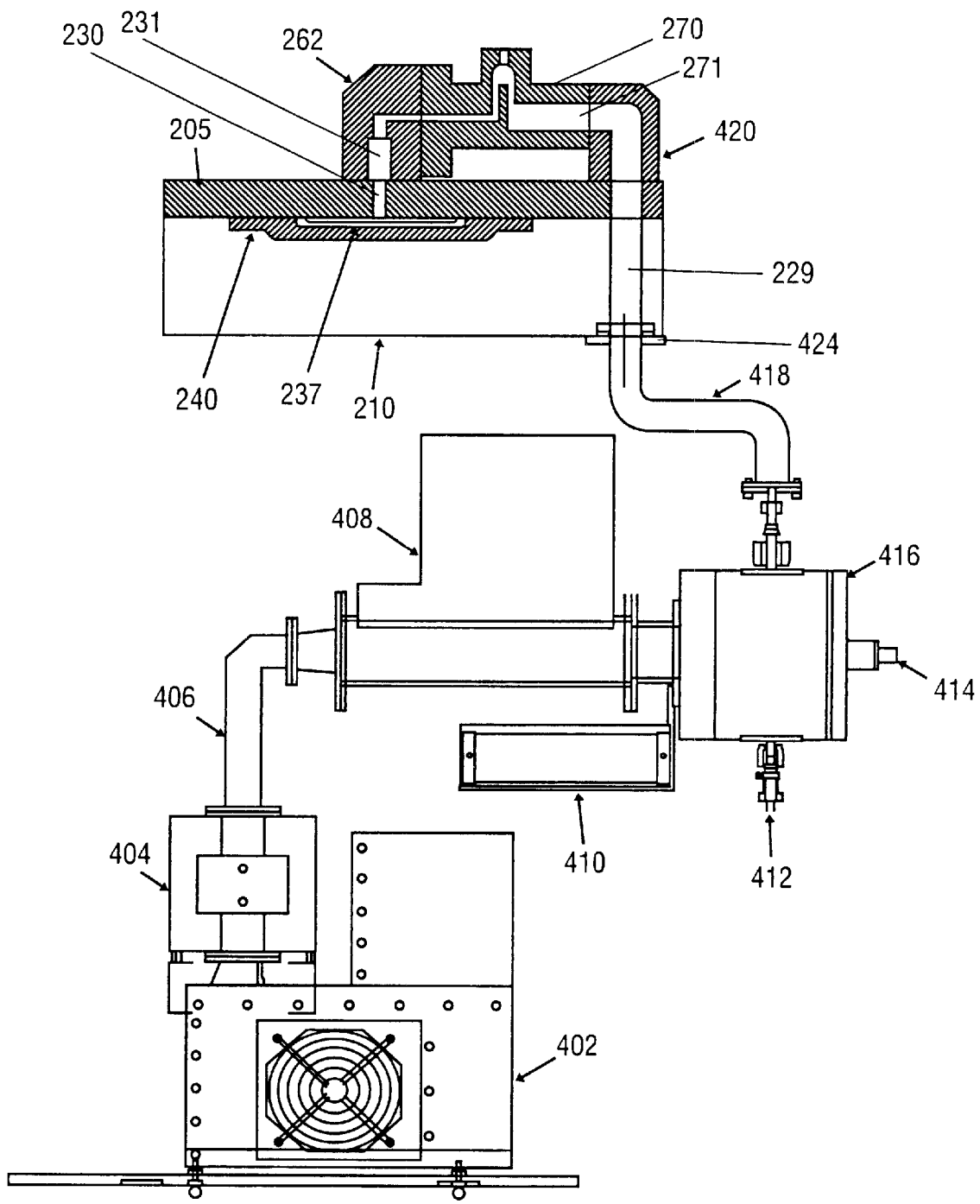
FIG. 16 is a schematic view of a typical remote plasma generator.

Turning now to FIG. 16 which is a schematic illustration of Remote Plasma System 400, the components and operation of remote plasma apparatus 400 can be better appreciated. Magnetron assembly 402 houses the magnetron tube, which produces the microwave energy. The magnetron tube consists of a hot filament cylindrical cathode surrounded by an anode with a vane array. This anode/cathode assembly produces a strong magnetic field when it is supplied with DC power from a power supply. Electrons coming into contact with this magnetic field follow a circular path as they travel between the anode and the cathode. This circular motion induces voltage resonance, or microwaves, between the anode vanes. An antenna channels the microwaves from magnetron 402 to isolator 404 and wave guide 406. Isolator 404 absorbs and dissipates reflected power to prevent damage to magnetron 402. Wave guide 406 channels microwaves from isolator 404 into auto tuner 408.

Auto tuner 408 matches the impedance of magnetron 402 and microwave cavity 416 to achieve the maximum degree of reflected power by adjusting the vertical position of three tuning stubs located inside wave guide 406. Auto tuner 408 also supplies a feedback signal to the magnetron power supply in order to continuously match the actual forward power to the setpoint. Auto tuner controller 410 controls the position of the tuning stubs within wave guide 406 to minimize reflected power. Auto tuner controller 410 also displays the position of the stubs as well as forward and reflected power readings.

Microwave applicator cavity 416 is where gas or gases supplied via gas supply inlet 412 are ionized. Gas supplied via gas supply inlet 412 enters a water cooled quartz or sapphire tube within microwave applicator 416, is subjected to microwaves and ionizes producing activated species which can then be used in cleaning and processing operations within processing region 202. One such cleaning gas is NF3 which can be used to supply activated fluorine for cleaning processing region 202 when a substrate 201 is not present in processing region 202. Activated species can also be used to anneal or otherwise process semiconductor or other materials present on a substrate 201 positioned within processing region 202. An optical plasma sensor 414 detects the existence of plasma within cavity 416. Activated species generated within microwave applicator cavity 416 are supplied to activated species chamber feed through 229 via adapter tube 418. Adapter tube 418 is insulated from the elevated temperature of chamber body 210 by adapter tube isolation disc 424.

From activated species chamber feed through 229, the activated species pass through lid bore-through 221 and enter activated species inlet block 420 which, together with activated species block 270, provide an o-ring sealed, air tight conduit i.e., activated species conduit 271, between lid bore-through 221 and central gas feed-through 231 within central mixing block 262.

Heated Exhaust System

Referring again to FIG. 15, the components and features of heated exhaust system 300 of processing system 100 can be better appreciated. The components of heated exhaust system 300 are collectively referred to as a foreline are in communication with a vacuum pump 355 (not shown) and wafer fabrication facility exhaust systems 340 (not shown) to provide for reduced pressure processing operations within processing region 202. Exhaust from processing and cleaning operations conducted within processing region 202 are exhausted via chamber exhaust port 305. When closed, isolation valve 310 shuts off chamber assembly 200 from down stream vacuum pump systems. During normal operation, isolation valve 310 is open and throttle valve 315 opens and closes to regulate pressure within processing region 202. By-pass inlet 320 receives precursor vapor/carrier gas mixture from chamber by-pass valve outlet 555 when chamber by-pass valve 545 is positioned to flow precursor vapor/carrier gas mixture to temperature controlled by-pass line 322. Exhaust system components exhaust port 305, isolation valve 310, throttle valve 315 and by-pass 320 and by-pass line 322 are temperature controlled to prevent unreacted precursor condensation. Cold trap 325 and remaining downstream exhaust system components are maintained at or below 75 degrees Fahrenheit. As a result, any unreacted vapor remaining in the exhaust stream from processing region 202 or vapor from chamber by-pass valve 545 will remain gaseous in the temperature controlled or heated portion of exhaust system 300 and then condense within cold trap 325 thus preventing damage to the vacuum pumps or accumulation and resulting line blockages within exhaust system piping. Additionally, collection of unreacted vapor within cold trap 325 also minimizes the exposure of maintenance personnel to potentially hazardous chemicals. Cold trap 325 is equipped with an isolation valve 330 for separating cold trap 325 from vacuum pumping systems to allow for routine maintenance or cleaning.

Figure 18:
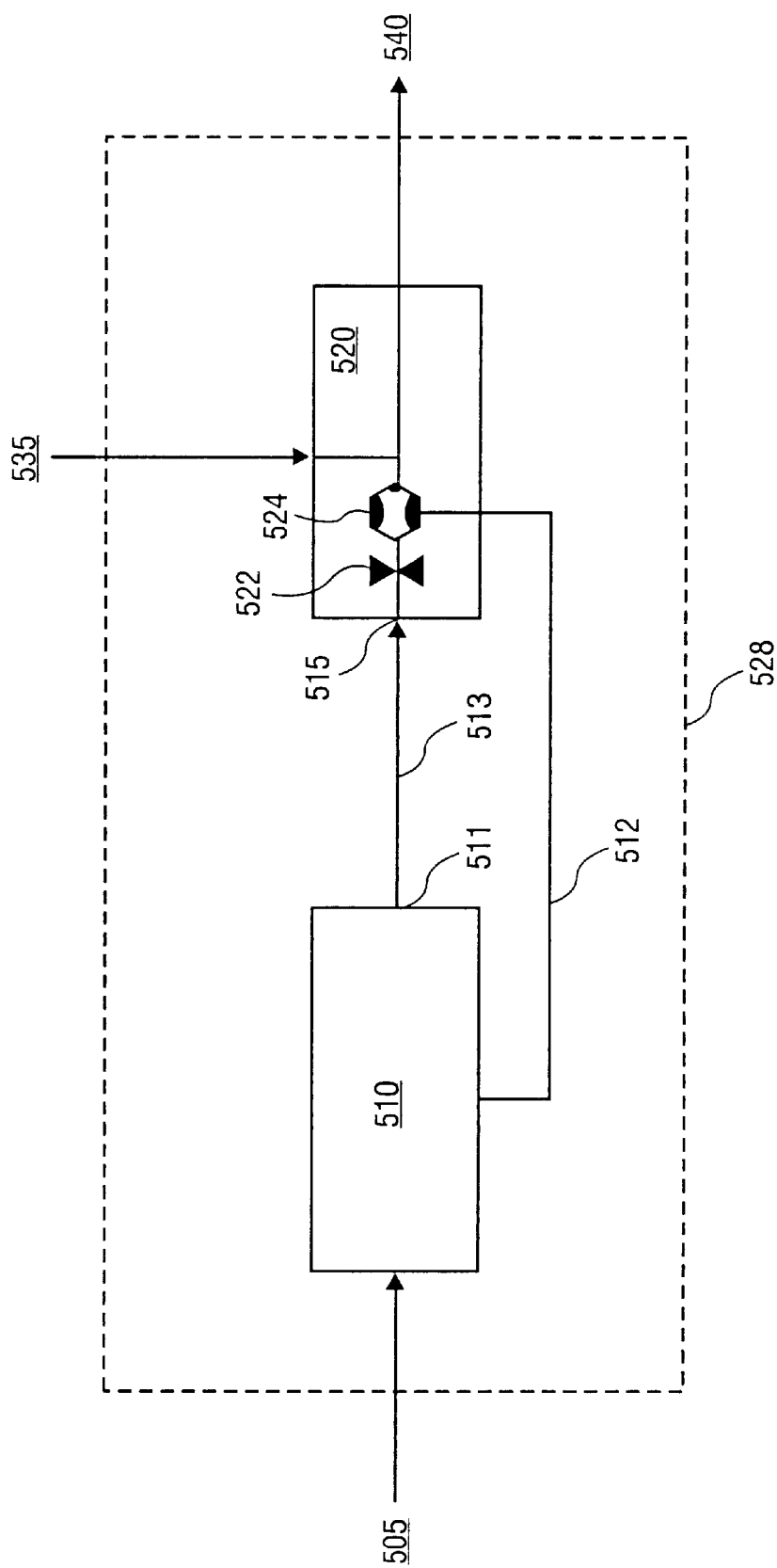
FIG. 18 is a schematic drawing of a representative liquid mass flow controller of the present invention.

In order not to unnecessarily obstruct a clear illustration of the relationships between the various components of exhaust system 300 and the other components of processing system 100, the independent thermocouple, controller, heater 275 utilized as part of the temperature controlled feature of exhaust system 300 is not shown in FIG. 15. Turning briefly to FIG. 18 which is a representative schematic embodiment of processing system 100 of the present invention, the temperature controlled conduits feature of exhaust system 300 can be better appreciated. A jacket style heater, thermocouple and controller 275 could be utilized to measure and maintain a set point temperature in exhaust port 305, isolation valve 310, throttle valve 315 and chamber bypass line 320 thereby creating a jacket heater controlled conduit 292 in the exhaust components upstream of cold trap 325. A separate thermocouple, controller and heater 275 operates on by-pass line 322 between chamber by-pass 545 and exhaust by-pass 320. As a result, chamber by-pass line 322 becomes a jacket style heater temperature controlled conduit 292 between chamber by-pass 545 and exhaust by-pass 320.

Vapor Delivery System

Figure 1:
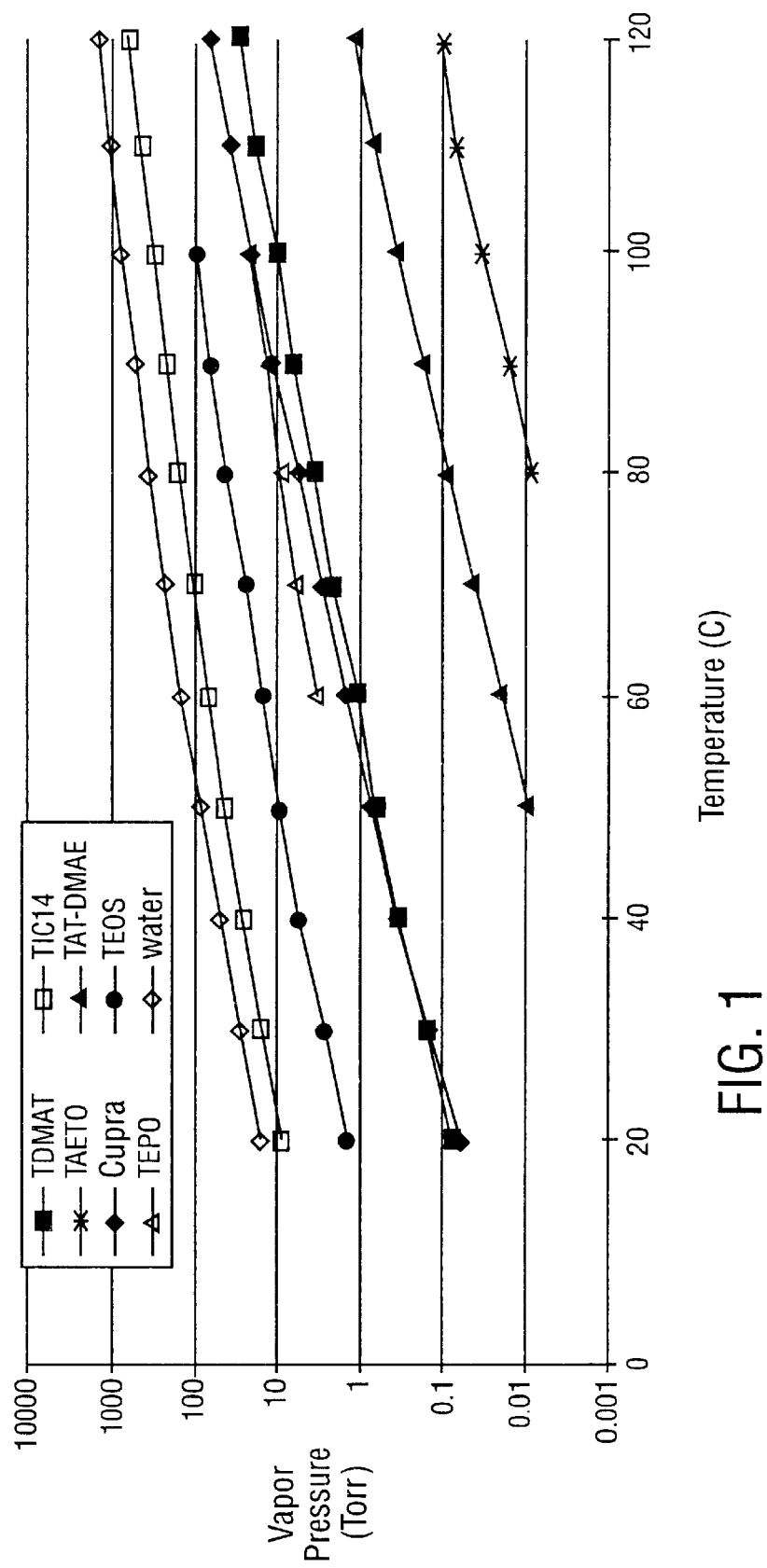
FIG. 1 is a graph of Vapor Pressure (Torr) vs. Temperature (°C.) of various compositions.
Figure 17:
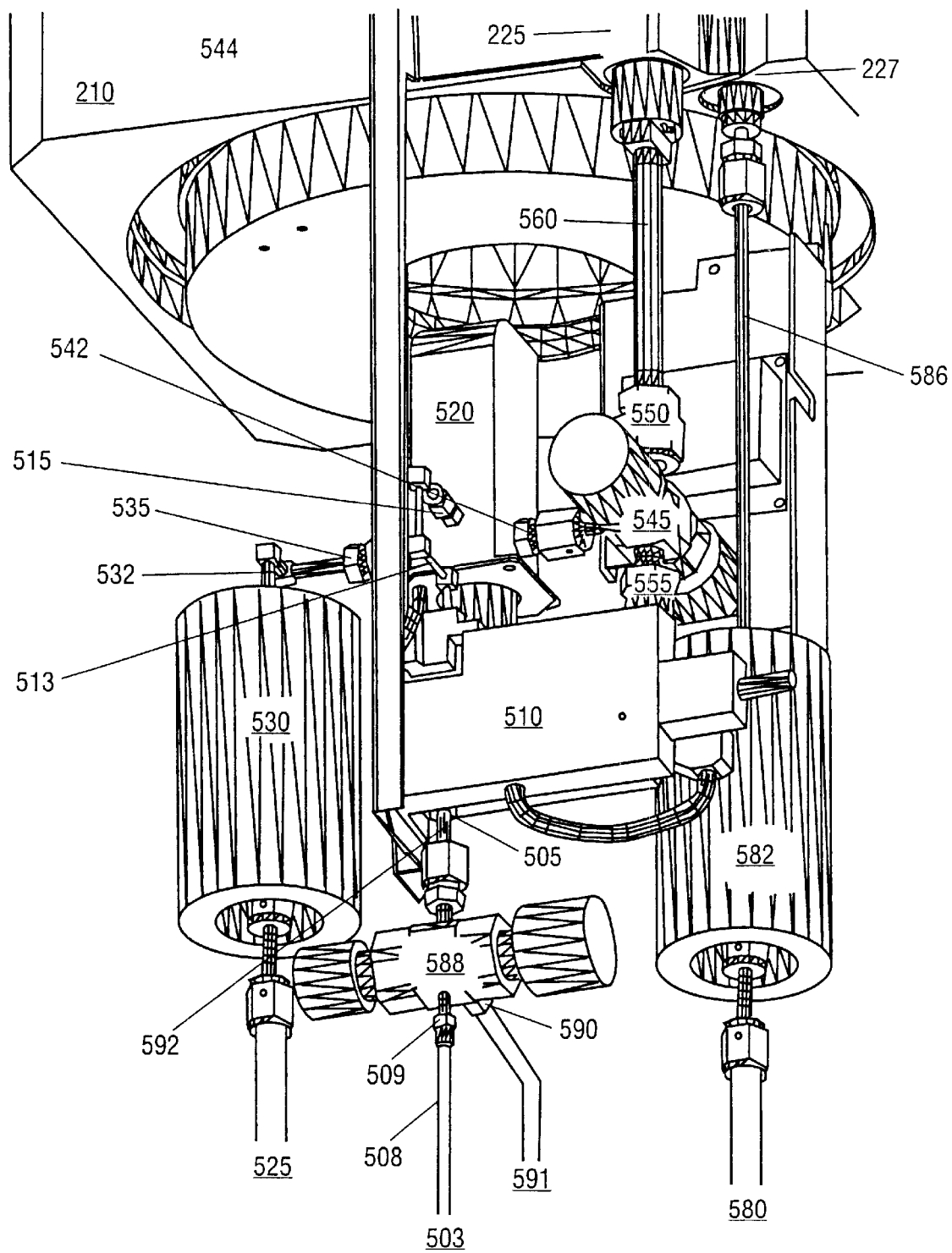
FIG. 17 is a perspective view of the vapor delivery system of the present invention.

Turning now to FIG. 17, the compact design feature of vapor delivery system 500 of the present invention can be better appreciated. Vapor delivery system 500 provides a method and an apparatus for supplying controlled, repeatable, vaporization of low vapor pressure precursors for film deposition on a substrate 201 located within processing region 202. One method provides for the direct injection of vaporized TAETO and TAT-DMAE. One of ordinary skill will appreciate the specific features detailed below which separately and when combined allow vapor delivery system 500 to vaporize and precisely control the delivery of liquid precursors including those precursors having vapor pressures significantly lower than precursors utilized in prior art vapor delivery systems or, specifically, precursors having vapor pressures below about 10 Torr at 1 atm and 100° C. (FIG. 1).

The various components of vapor delivery system 500 are placed in close proximity to chamber 200 in order to minimize the length of temperature controlled vapor passageways between the outlet of vaporizer 520 and processing region 202. Even though practice in the semiconductor processing arts is to place vapor systems remotely from processing chambers to either ensure serviceability or reduce the amount of cleanroom space occupied by a processing system, vapor delivery system 500 of the present invention utilizes an innovative compact design which allows all system components—less bulk liquid precursor, carrier gas and process gas supplies—to be located directly adjacent to chamber 200 in close proximity to precursor and process gas chamber feed throughs 225 and 227.

A low vapor pressure liquid precursor, such as TAT-DMAE or TAETO, can be stored in bulk storage container 503 located remotely or on mainframe support 105 in proximity to processing chamber 200. Liquid precursor stored in tank 503 is maintained under pressure of an inert gas such as Helium at about 15 to 60 psig. The gas pressure within tank 503 provides sufficient pressure on the liquid precursor such that liquid precursor flows to other vapor delivery system components thus removing the need for a pump to deliver the liquid precursor. The outlet of delivery tank 503 is provided with a shut-off valve 507 (not shown) to isolate bulk tank 503 for maintenance or replenishment of the liquid precursor. As a result of the pressure head on tank 503, liquid precursor from tank 503 is provided to liquid supply line 508 and the precursor inlet 509 of precursor/solvent inlet valve 588. When aligned for liquid precursor, precursor/solvent valve 588 provides liquid precursor to precursor/solvent outlet 594 and into precursor/solvent supply line 592 to liquid flow meter inlet 505. Liquid flow meter 510 measures precursor flow rate and provides via liquid flow meter outlet 511 liquid precursor to vaporizer supply line 513 and then to vaporizer inlet 515. Vaporizer 520 in conjunction with a heated carrier gas (described below) converts the liquid precursor into precursor vapor.

A carrier gas, such as nitrogen or helium, is supplied into carrier gas heat exchanger inlet 525 at a pressure of about 15 psi. Carrier gas heat exchanger 530 is a gas to resistive heater type heat exchanger like Model HX-01 commercially available from Lintec. Carrier gas heat exchanger 530 preheats the carrier gas to a temperature such that the heated carrier gas stream entering vaporizer 520 does not interfere with the efficient vaporization of the precursor liquid undergoing vaporization within vaporizer 520. Heated carrier gas is provided to vaporizer 520 via carrier gas supply line 532 and carrier gas inlet to vaporizer 535. The heated carrier gas should not be heated uncontrollably since a carrier gas heated above the decomposition temperature of the precursor undergoing vaporization could result in precursor decomposition within vaporizer 520. Thus, carrier gas heat exchanger 530 should heat the carrier gas into a temperature range bounded by, at the lower limit, the condensation temperature of the precursor and, at the upper limit, the decomposition temperature of the precursor. For a tantalum precursor such as TAT-DMAE for example, a representative vaporization temperature is about 130° C. and a decomposition temperature is about 190° C. A typical carrier gas such as nitrogen could be provided to a vaporizer 520, which is vaporizing a tantalum precursor such as TAT-DMAE, at about between 200 and 2000 standard cubic centimeters per minute (sccm) and a temperature of about between 130° C. and 160° C. These conditions result in a vaporized precursor flow rate in the range of about 10–50 milligrams per minute. Carrier gas temperature can also be such that the temperature of the carrier gas entering vaporizer 520 is at least as high if not higher than the vaporization temperature of the precursor being vaporized in vaporizer 520. Of particular concern is the prevention of precursor vapor condensation within the small diameter conduits which exist within vaporizer 520. As such, carrier gas temperatures below vaporization conditions within vaporizer 520 could sufficiently cool the vaporized precursor, result in condensation and should therefore be avoided.

Referring now to FIG. 18, which schematically represents the operation of liquid flow meter 510 in conjunction with vaporizer 520, which are referred to collectively as liquid mass flow controller 528. Liquid precursor enters liquid flow meter 510 which generates measured flow rate signal 512. A typical flow rate signal is measured in milligrams per minute or mg/min. A representative flow rate for a TAT-DMAE precursor is 35 mg/min. for a representative $Ta_2O_5$ film produced utilizing the method and apparatus of the present invention. The now measured precursor flow exits liquid flow meter outlet 511 into vaporizer supply line 513 and then into vaporizer inlet 515. Vaporizer supply line 513 is typically 0.125 inch outer diameter stainless steel piping. Another aspect of liquid mass flow meter 528 is that the length of vaporizer supply line 513 is minimized to attain controllable low vapor pressure precursor output from vaporizer 520. Minimizing the distance between liquid flow meter 510 and vaporizer 520 adds to the number of vapor delivery system 500 components placed in proximity to processing system 100 as well as increases the density of equipment mounted on mainframe 105. However, vapor delivery system 500, along with the remote plasma system 400 and heated exhaust system 300 have been designed to minimize interference between the subsystems of processing system 100 while achieving the compact design desired in cluster tool wafer processing systems. Although remote placement of liquid flow meter 510 further away from vaporizer 520 would reduce the amount of vapor delivery components in proximity to processing system 100, more effective liquid metering and control is achieved by minimizing the distance between the liquid flow meter outlet 511 and vaporizer inlet 515. Vaporizer inlet 515 to liquid flow meter outlet 511 spacing of about 6 inches or between about 4 inches and 15 inches leads to more effective metering and controlled vaporization of low vapor pressure precursors such as TAETO, TAT-DMAE or other liquid precursors having a vapor pressure of below about 10 Torr at 100° C. and 1 atm.

Another feature of a the liquid mass flow controller 528 of the present invention is positive shut-off valve 522. Located within vaporizer 520 between vaporizer inlet 515 and metering valve 524, positive shut-off valve 522 provides the capability to cut-off liquid flow before the vaporization point within vaporizer 520. Metering valve 524 can provide a shut-off capability when in a 'closed' or zero set-point condition. However, positive shut-off valve 522 provides added assurance that no liquid will continue to flow through vaporizer 520 when liquid mass flow controller 528 is in a 'closed' or zero set-point condition. The position of positive shut-off valve 522 relative to metering valve 524 is such that there is a minimal volume of liquid which could remain in the line between shut-off valve 522 and metering valve 524. A representative vaporizer 520 suitable for vaporization of low vapor pressure liquids could position positive shut-off valve 522 about one inch or less from metering valve 524. Thus, utilizing a 0.125 inch diameter line between shut-off valve 522 and metering valve 524 a minimal liquid volume of about 0.012 cubic inches of precursor is created. By reducing the volume between these components the amount of precursor which could vaporize after positive shut-off valve 522 is closed is minimized. Thus, positive shut-off valve 522 provides redundancy to the shut-off capabilities of metering valve 524 as well as provides a minimal volume of liquid which could still be vaporized even if liquid mass flow controller 528 is in a open or 100% flow set-point condition and positive shut-off valve 522 is closed.

Referring now to FIG. 17, vaporized precursor flows from vaporizer outlet 540 into vaporizer outlet line 542 into vapor inlet 544 of temperature controlled by-pass valve 545. When aligned to "chamber" position, by-pass valve 545 supplies vapor to chamber outlet 550 and then into temperature controlled vaporized precursor supply line 560. A feature of the vapor delivery system 500, but omitted for clarity, is the thermocouple, controller, jacket style heater system 275 which maintains a temperature set-point within vaporizer outlet line 542, chamber by-pass valve 545 and vaporized precursor supply line 560. The internal piping of chamber by-pass valve 545 allows vaporized precursor/heated carrier gas mixture to be sent to processing region 202 via outlet to chamber 550. Additionally or alternatively, while stabilizing vapor flow or conducting cleaning operations within processing region 202, chamber by-pass valve 545 could direct the vaporized precursor/heated carrier gas mixture to heated by-pass line 320 of heated exhaust system 300 (described above) via outlet to by-pass 555. One advantage of chamber by-pass valve 545 of the present invention is that once liquid mass flow controller 528 attains a desired set-point vapor flow rate the vaporized precursor/heated carrier gas mixture can either be directed to the chamber for deposition or to the foreline by-pass inlet 320 for disposal. Independent of operations within processing region 202, liquid mass flow controller 528 continues to produce a stable, consistent vapor flow rate. Thus, chamber by-pass valve 545 used in conjunction with liquid mass flow controller 528 provides the repeatable, stable vapor flow rates to consecutive substrates 201 within processing region 202. Such repeatable, stable vapor flow rates are necessary for the deposition of transition metal dielectric materials such as tantalum oxide for use in high capacity ICs such as stacked capacitors.

Vaporizer outlet line 542 and precursor supply line 560 are standard piping which could be made of stainless steel. Vaporized precursor supply line 560 should be as short as possible to minimize the length of travel of vaporized precursor within the system or between about 4 to 6 inches. Precursor supply line 560 is in communication with chamber outlet 550 and precursor chamber heated feed-through 225. In order to prevent condensation of the vaporized precursor within the vaporized precursor/heated carrier gas mixture, heated precursor supply line 560 and vaporizer outlet line 544, like all precursor supply conduits downstream of vaporizer 520, have an inner diameter which is greater than the inner diameter of the liquid supply line into vaporizer 520. Typically, the vaporizer liquid supply line is made of stainless steel with about a 0.125 inch inner diameter while the conduits downstream of vaporizer 520 could have a larger diameter or an outer diameter of about 0.5 inches or an inside diameter of about 0.4 inches. Larger diameter conduits downstream of vaporizer 520 exposes the vaporized precursor/heated carrier gas mixture to an expansion volume and corresponding reduction in pressure which helps maintain the vaporized low vapor pressure precursor within an operational temperature region above the precursor condensation temperature and below its decomposition temperature for the conditions within the vapor supply conduits. Since vaporized precursor supply line 560 and vaporizer outlet 542 are heated by a thermocouple, controller, jacket style heater 275, temperatures within vaporized precursor supply line 560 and vaporizer outlet 542 are maintained above the condensation temperature and below the decomposition temperature of the vaporized precursor or between about 100° C. and 190° C.

Vapor delivery system 500 also has a temperature controlled process gas feature. Process gas heat exchanger 582 which is similar to carrier gas heat exchanger 530 described above receives process gas from process gas supply 580. Suitable process gases depend on the desired film deposition. Typically, oxygen ($O_2$) and nitrous oxide ($N_2$) are suitable for oxidation processes and ammonia ($NH_4$) is suitable for nitride processes. Additionally, nitrogen ($N_2$) could be added to the process gas flow as a ballast gas. The term process gas stream used below refers to all gas flows out of heat exchanger 582 and is intended to include process gas, ballast gases or other gases described below. Process gases and ballast gases can be preheated by process gas heat exchanger 582 so that the resulting process gas stream is maintained above the temperature of the adjacent vaporized precursor gas stream. Maintaining the process gas stream temperature above about 10°–15° C. above the temperature of the vaporized precursor gas stream assists in the prevention of inadvertent condensation of the precursor vapor when the gas streams intersect and begin to mix within mixing conduit 278. Similarly, heat exchanger 582 can also ensure process gas stream temperatures are maintained below the decomposition temperature of the precursor gas stream so that inadvertent decomposition of the precursor vapor stream does not occur when the gas streams mix within mixing conduit 278.

Thus, a temperature controlled gas stream exits process gas heat exchanger 582 via outlet 584 and enters process gas supply line 586. From process gas supply line 586 the process gas stream flows through process gas chamber feed-through 227 which in turn flows into heated process gas inlet conduit 276. Process gas inlet conduit 276 flows into and mixes with vaporized precursor flow stream in heated mixing manifold 278. Process gas heat exchanger 582 heats the process gas to a sufficient temperature such that when the process gas mixes with the vaporized precursor in mixing conduit 278 the precursor vapor neither decomposes nor condenses.

Another feature of vapor delivery system 500 is the ability to provide a solvent flush capability to those conduits which come into contact with the vaporized low vapor pressure precursors. Such solvent operations further the operability of the method and apparatus of the present invention to vaporize low vapor pressure liquids such as TAETO and TAT-DMAE. A solvent such as anhydrous isopropyl alcohol, methanol, hexane, ethanol, or other suitable solvent is supplied into precursor/solvent three-way valve 588 via solvent inlet 590. From bulk solvent supply 591 solvent is introduced into the vapor delivery system 500, via 3-way valve 588 and follows the same flow path as a vaporized precursor through the various components of vapor delivery system 500 and, depending upon chamber by-pass valve 545 alignment, to chamber 200 or exhaust system 300 via by-pass line 322. As the solvent flows through the various conduits which are exposed to liquid precursor such as the conduits of and within liquid mass flow controller 528, the solvent mixes with precursor liquid and purges the line of residual precursor which then allows exposure of the components to air for maintenance or component change. Without the solvent flush capability and as a result of the low vapor pressure of typical precursors vaporized using the methods and apparatus of the present invention, residual precursor vapors within conduits exposed to the low vapor pressure precursor would not be sufficiently evacuated nor achieve reduced pressures in a timely—commercially viable—manner simply utilizing only pumping systems 355 of exhaust system 300. Additionally, the solvent flush feature can be utilized to remove precursor vapor from process conduits and components to prevent risk of exposure to potentially hazardous materials during maintenance as well as prevent the undesired reaction of precursor vapor with air, water vapor or other materials.

CVD Deposition System Operation

Figure 19:
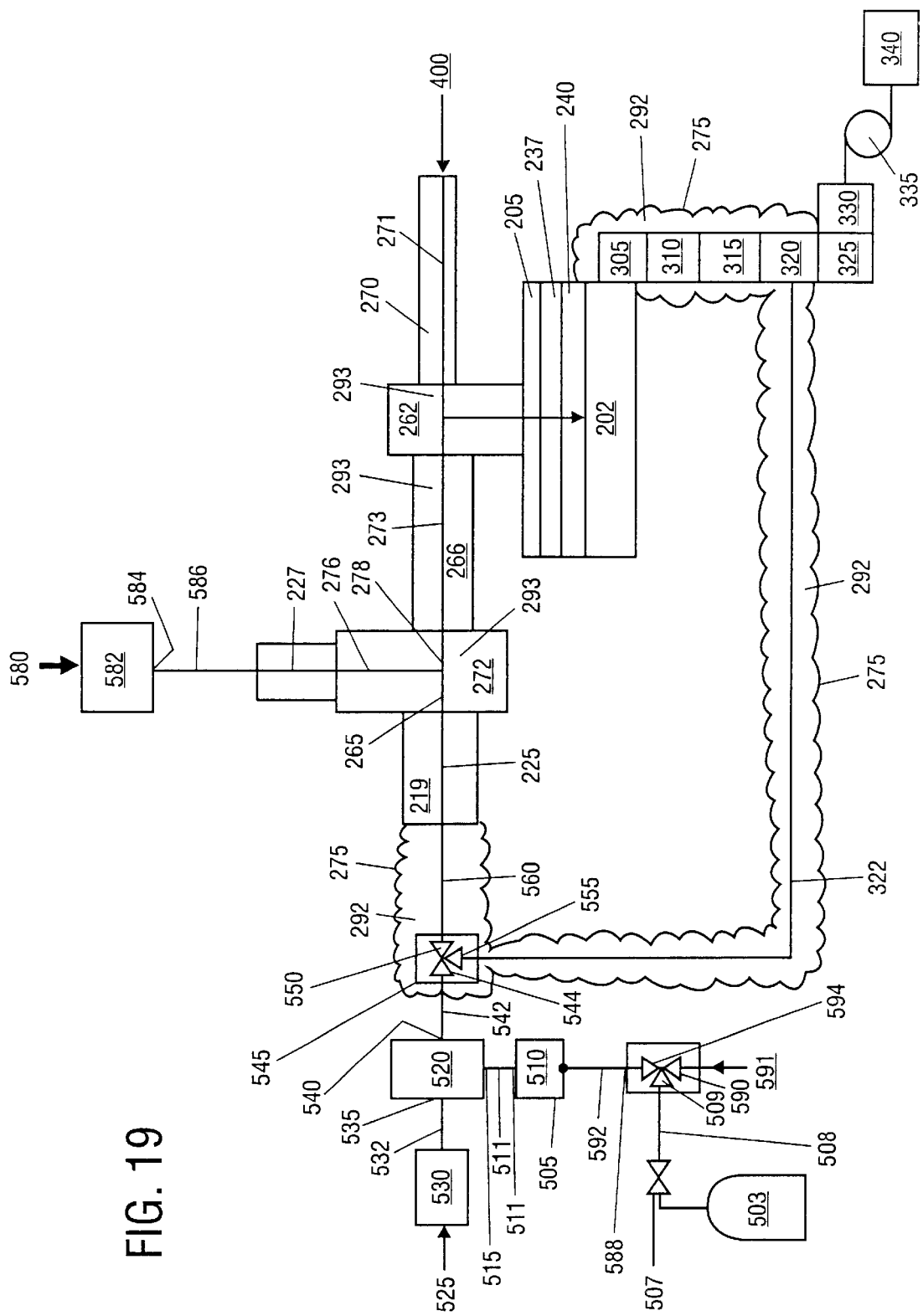
FIG. 19 is a schematic drawing of a representative liquid delivery system having one vaporizer.
Figure 20:
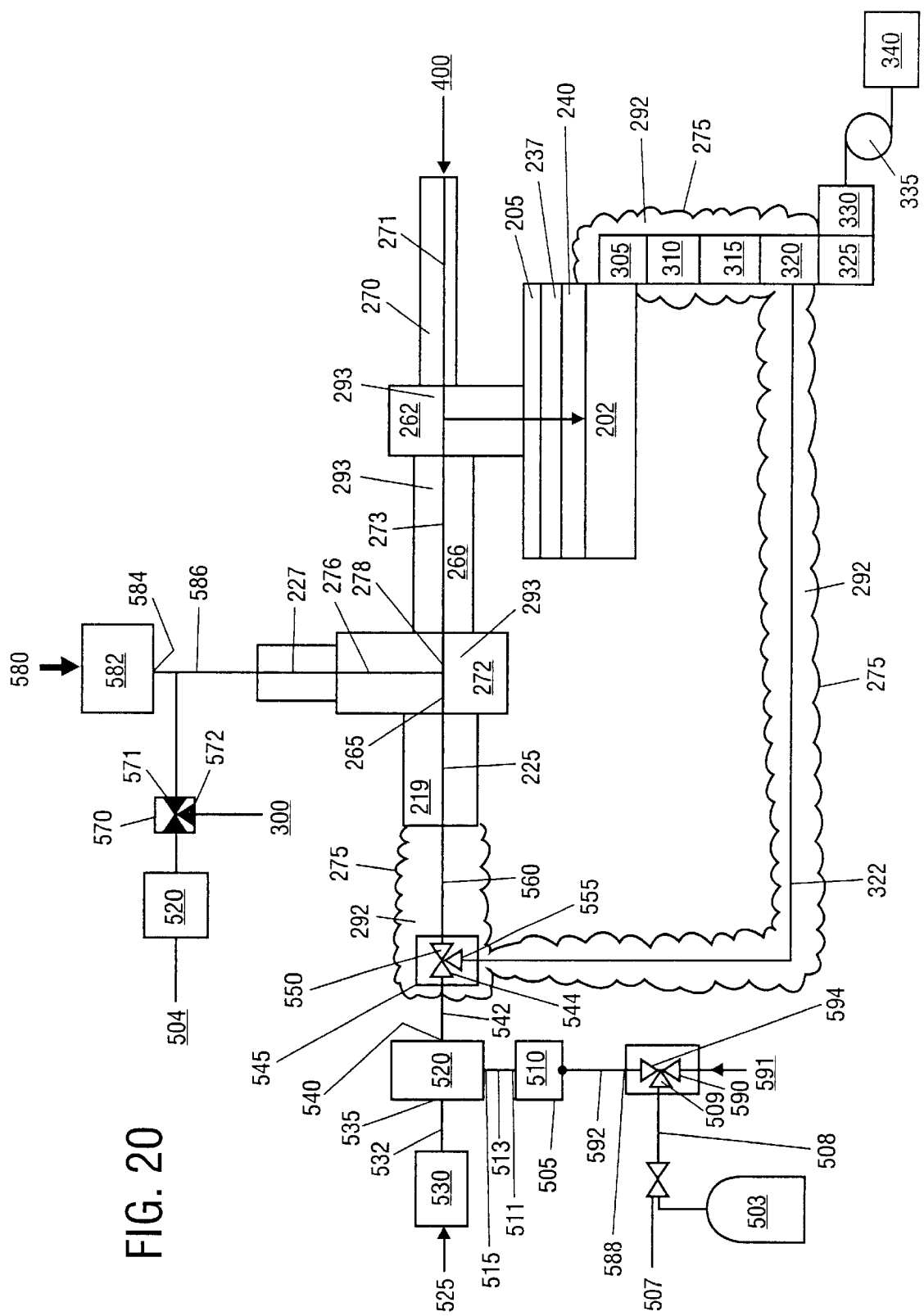
FIG. 20 is a schematic drawing of a representative liquid delivery system having two vaporizers.

Referring now to FIGS. 19 and 20, an integrated method of operating CVD deposition system 100 and the use and interoperability of dopant, second dielectric or second precursor materials within the various embodiments of the present invention can be better understood. FIG. 19 schematically represents a system configuration when a single vaporizer and process heat exchanger are utilized to provide process gas/precursor vapor mixtures to temperature controlled conduits 292 and 293 and processing region 202. FIG. 20 is similar to FIG. 19 with the addition of a second vaporizer 520, bulk supply 504 and by-pass valve 570. Under the representative configuration of FIG. 20, processing system 100 of the present invention is further enabled to not only provide, mix, and deposit films from a single precursor (FIG. 19) but also, by modifying the liquid source contained in bulk supply 204, films containing a second precursor, a dopant or a metal.

Deposition system 100 as embodied in FIG. 20 operates similarly to previous descriptions of processing system 100 with the addition of an additional bulk supply 504 which could be under a pressure head as with bulk supply tank 503. Bulk supply 504 is coupled to and supplies processing fluids to a second vaporizer 520 which operates similarly to the first vaporizer 520 as embodied in FIG. 19 and described above. The vaporized precursor stream created by the second vaporizer 520 is provided to a chamber by-pass valve 570 which can align—via outlet 571—the vaporized gas stream to chamber 200 via process gas supply line 586. Alternatively, by-pass valve 570 can align the vaporized precursor stream to exhaust system 300 via outlet 572. In the embodiment of FIG. 20, bulk supply 504 could contain a wide variety of fluid processing source materials such as dopants, precursor materials, metals, or other materials with a sufficiently high vapor pressure that vaporization may occur without a carrier gas, heated carrier gas or will remain vaporized without temperature controlled conduits described above in relation to the low vapor pressure precursor utilized and described above. Therefore, what is not shown, but an object of the present invention is modification of the second vaporizer 520 and other components of FIG. 20 to include a carrier gas or heated carrier gas used in conjunction with second vaporizer 520 and the use of the temperature control methods described above to provide temperature controlled conduits from the outlet of the second vaporizer 520 to three-way valve 570 and including process gas supply line 586 in order that low vapor pressure precursors could also be provided to and effectively utilized by second vaporizer 520 of FIG. 20.

Another object of the vapor delivery system 500 present invention is the deposition of a variety of films on substrates 201 within process area 202 by advantageously selecting precursors bulk supplies 504 and 503, process gases, process gases or ballast gases for gas source 580 and by selective positioning of by-pass valves 570 and 545. One advantage of the 2 vaporizer—2 by-pass configuration of FIG. 20 is that each vaporizer may be in operation and producing stable, repeatable flow which, by aligning the appropriate by-pass 570 or 545, could easily be ported to process region 202 or exhaust system 300. Some of the possible combinations mentioned above are detailed in FIG. 21.

Referring now to FIG. 21, several representative vapor combinations utilizing the configuration of FIG. 20 can be appreciated. FIG. 21 provides 10 liquid alignment configurations which refer to the specific positions of chamber by-pass valves 545 and 570, the contents of bulk sources 503 and 504, process gas source 580 and the resultant vapor mixture delivered to processing area 202. The Liquid Alignment Configurations listed in FIG. 21 can be categorized into three broad mixture groups: tantalum oxide mixtures, dielectric mixtures and electrode mixtures.

Liquid Alignment Configurations 1–4 are directed towards tantalum containing mixtures. Since only a single bulk source 503 and vaporizer 520 is utilized, configuration 1 could be embodied by either FIG. 19 or on FIG. 20 where chamber by-pass valve 570 is aligned to by-pass outlet 572. Whether FIG. 19 or 20 is used, bulk source 503 contains a tantalum containing precursor such as TAT-DMAE or TAETO which is vaporized and provided to chamber by-pass 545. Chamber by-pass 545 is aligned to chamber or outlet 550 so the vaporized Tantalum flows through chamber by-pass outlet 550 through temperature controlled conduits 275, 219 and 293 into mixing manifold 278. At the same time, process gas supply 580 provides an oxygen containing process gas to gas heat exchanger 582 which heats the gas to a setpoint and provides the gas to process gas supply line 586. From process gas supply line 586, the process gas flows through conduit 227 and temperature controlled conduit 276 into mixing manifold 278 where the process gas and tantalum vapor flows converge, mix and form a homogenous mixture before arriving in processing region 202. The vapor mixture described above is suitable for deposition of tantalum oxides. In liquid alignment configurations 2,3 and 4, the tantalum precursor is vaporized and the oxygen containing process gas is heated as described above. Additionally, bulk source 504 contains and is utilized to provide material which is vaporized in second vaporizer 520. The vapor stream produced by second vaporizer 520 is provided via chamber by-pass outlet to chamber 571 to process gas supply line 586.

A heater, controller, thermocouple temperature control system, similar to that utilized with the vaporized precursor stream produced by the first vaporizer 520, could also be utilized with the conduits which carry vaporized precursor stream provided by second vaporizer 520 to process gas supply line 586 in order to prevent inadvertent condensation or decomposition of the vaporized precursor gas stream. FIG. 20 embodies a second bulk supply 504 with a material which can produce a stable output from second vaporizer 520 without requiring a carrier gas, heated carrier gas or temperature controlled conduit for the successful use of the second vapor stream.

In liquid alignment configuration 2, bulk source 504 contains an aluminum precursor and chamber by-pass 570 is aligned to outlet 571. One representative aluminum precursor is aluminum nitrate dissolved in etoxide, ethynol, acilic acids or other suitable solution. One of ordinary skill will appreciate that a wide variety of liquid aluminum precursors could be utilized in the aforementioned apparatus of the present invention. As a result of this configuration, the vaporized aluminum precursor flow will merge and mix with the oxygen containing process gas in process supply line 586. The process gas/aluminum precursor mixture then flows through conduit 227 into temperature controlled conduits 276 and then into mixing manifold 278 where the process gas/aluminum vapor stream mixes with tantalum vapor gas stream. Homogenous process gas/precursor mixtures can be obtained in processing area 202 by advantageously selecting the position of mixing manifold or point 278 relative to processing region 202 so that sufficient mixing occurs between mixing manifold 278 and a substrate 201 located within processing area 202. Similarly, a titanium containing bulk supply 504 (Liquid Alignment Configuration 3) or a dopant containing bulk supply 504 (Liquid Alignment Configuration 4) could be utilized resulting in vapor mixtures within process region 202 which form titanium doped tantalum oxide or, more generally, a doped tantalum oxide. One representative titanium precursor is titanium tetratusisoprepoxide, referred to as TiPT. Those of ordinary skill will appreciate that a wide variety of titanium precursors may be efficiently utilized in processing system 100 via the vapor delivery system 500 described above.

Liquid Alignment Configurations 5, 6 and 7 are directed towards the use of the second bulk source to provide a dielectric material into processing chamber 200. In these three configurations, the first bulk delivery source 503 is not listed since even if the first vaporizer 520 associated with bulk supply 503 were in operation the vapor stream produced by first vaporizer 520 is aligned via chamber by-pass outlet 555 to exhaust system 300. Liquid Alignment Configuration 5 utilizes a bulk supply 504 containing an aluminum liquid source which after vaporization is provided to process gas supply line 586 via chamber by-pass outlet 571 is open. The vaporized aluminum precursor then mixes with an oxygen containing process gas from supply 580 which has been preheated by heat exchanger 582. The process gas and aluminum vapor mix while flowing towards processing region 202 resulting in a homogenous mixture suitable for aluminum oxides deposition on substrates 201 located within processing region 202. Similarly, a titanium containing source or, generally, a dielectric precursor material may be placed in bulk source 504 (Liquid Alignment Configurations 6 and 7) which would then result, respectfully, in mixtures and deposition within processing region 202 of titanium oxides or dielectric oxides.

Liquid Alignment Configurations 8, 9 and 10 provide configurations which result in a variety of nitrides or electrode materials in processing region 202. In Liquid Alignment Configurations 8,9, and 10, the process gas source 580 contains nitrogen, for example ammonia ($NH_3$), and bulk source 504 contains aluminum, titanium or other electrode material precursor. Utilizing the second vaporizer 520 associated with bulk supply 504, deposition mixtures which result in aluminum based compounds (configuration 8), titanium nitrides (configuration 9) and generally nitrides suitable for forming electrodes (configuration 10) are provided to processing region 202.

As a result of the numerous liquid alignment configurations enabled by the vapor delivery system embodied in FIG. 20, multiple film layers can be deposited on a substrate within processing region 202 by advantageously selecting precursor materials for bulk supplies 503 and 504 and providing both oxygen and nitrogen containing gases via process gas source 580. For example, a vapor delivery system 500 having a bulk source 503 containing tantalum, a bulk source 504 containing aluminum and a process gas source 580 containing both oxygen and nitrogen, with both the first and second vaporizers 520 in operation can form films such as tantalum oxides (Liquid Alignment Configuration 1) aluminum doped tantalum oxides (Liquid Alignment Configuration 2), aluminum oxides (Liquid Alignment Configuration 5) and aluminum nitrides (Liquid Alignment Configuration 8) can be formed within processing region 202.

In another representative example, a vapor delivery system 500 which has a bulk source 503 containing tantalum, a bulk source 504 containing titanium and a process gas source 580 containing both oxygen and nitrogen, with both the first and second vaporizers 520 in operation can form films such as tantalum oxides (Liquid Alignment Configuration 1), titanium doped tantalum oxides (Liquid Alignment Configuration 3), titanium oxides (Liquid Alignment Configuration 6) and titanium nitrides (Liquid Alignment Configuration 9) can be formed within processing region 202.

In another example, a vapor delivery system 500 could have a bulk process gas supply 580 containing nitrogen, oxygen and other processing gases and both chamber by-pass 545 and 580 are aligned such that outlets 555 and 572 are open and no vaporized precursor reaches processing region 202. Such a configuration would allow only process gases into processing region 202 or, if the flow of all process gas were stopped, only activated species from remote plasma system 400 would be provided to processing region 202. Utilizing this configuration enables a variety of thermal and activated processes to occur within processing region 202 such as thermal or activated anneals, oxidation as well as utilizing remotely activated species from remote plasma system 400 to clean processing area 202.

While specific embodiments of the invention have been shown and described, further modifications and improvements will occur to those skilled in the art. It is desired that it be understood, therefore, that the invention is not limited to the particular form shown and it is intended in the appended claims which follow to cover all modifications which do not depart from the spirit and scope of the invention.

We claim:

1. An apparatus for dispersing gases within a processing chamber, said apparatus comprising a gas distribution plate having a plurality of apertures, said apertures comprising:
    (a) an inlet surface having a circular opening coupled to a cylindrically shaped first conduit;
    (b) an outlet surface having a circular opening coupled to a cylindrically shaped second conduit with a first length; and
    (c) a conically shaped conduit in communication with said cylindrically shaped first and second conduits, said conically shaped conduit having walls of a second length, wherein said walls diverge toward the outlet surface and said first length is about 5.5 times larger than said second length.

2. An apparatus according to claim 1 wherein said conically shaped conduit and said cylindrically shaped second conduit are axially symmetric to a common centerline.

3. An apparatus according to claim 1 wherein said cylindrically shaped first conduit has a first diameter and said cylindrically shaped second conduit has a second diameter, and wherein said second diameter is about 3 times larger than said first diameter.

4. An apparatus according to claim 1 wherein said cylindrically shaped second conduit has a second diameter, and wherein said first length is about 2.5 times larger than said second diameter.

5. An apparatus for distributing gases within a processing chamber, said apparatus comprising a gas distribution plate having a plurality of apertures, said apertures comprising:
    (a) a first cylindrical region having a first diameter coupled to an inlet surface of the gas distribution plate;
    (b) a second cylindrical region directly coupled to an outlet surface of the gas distribution plate, said second cylindrical region having a second diameter and walls having a first length; and
    (c) a conical region in communication with said first and second cylindrical regions, said conical region further comprising walls having a second length, wherein said walls diverge toward the outlet surface and said first length is at least 1.5 times as long as said second length.

6. An apparatus according to claim 5 wherein said second diameter is greater than said first diameter.

7. An apparatus according to claim 5 wherein the walls of said conical region form an angle between about 20 degrees and 90 degrees.

8. An apparatus according to claim 5 wherein said first length is about 5.5 times larger than said second length.

9. An apparatus according to claim 5 wherein said first length is less than said second diameter.

10. A method of flowing gas through a gas distribution plate, said method comprising the steps of:
    (a) first flowing a gas through a first cylindrical region having a first diameter; followed by
    (b) flowing said gas through a conical region fluidly connected to said first cylindrical region, said conical region having diverging walls with a first length, wherein said walls diverge away from said first cylindrical region; followed by
    (c) flowing said gas through a second cylindrical region fluidly connected to said conical region, said second cylindrical region having a second diameter and walls of a second length, wherein said second length is at least twice as long as the length of said first length.

11. The method according to claim 10 wherein said second diameter is greater than said first diameter.

12. A method for absorbing radiation within a gas distribution plate, said method comprising the steps of:
    (a) placing a substrate in a processing apparatus having a gas distribution plate wherein said gas distribution plate includes a plurality of apertures comprising an inlet with a first cylindrical region, an outlet with a second cylindrical region having a first wall length, and a conical region located between said first and second cylindrical regions, said conical region having walls of a second wall length and opening towards said second cylindrical region, wherein said first wall length is at least twice as long as said second wall length;
    (b) generating radiation from said substrate wherein said radiation is incident to said gas distribution plate; and
    (c) absorbing a portion of said incident radiation in said apertures.

13. A method according to claim 12 wherein a portion of said incident radiation is reflected off said conical region and absorbed in said first cylindrical region.

14. A method according to claim 12 wherein a portion of said incident radiation is reflected off said conical region and absorbed in said second cylindrical region.

15. A gas distribution plate for distributing gases within a process chamber, the gas distribution plate comprising an inlet surface, an outlet surface, and a plurality of apertures formed between the inlet and outlet surfaces, each aperture comprising:
    (a) a first cylindrical region having a first diameter and a first length;
    (b) a second cylindrical region having a second diameter and a second length, wherein the second cylindrical region is positioned between the first cylindrical region and the outlet surface; and
    (c) a conical region positioned between the first and second cylindrical regions, the conical region having walls of a third length, wherein the walls diverge toward the outlet surface and the second length is at least twice as long as the third length.

16. A gas distribution plate for distributing gases within a process chamber, the gas distribution plate comprising an inlet surface, an outlet surface, and a plurality of apertures formed between the inlet and outlet surfaces, each aperture comprising:
    (a) a first cylindrical region directly coupled to the inlet surface, the first cylindrical region having a first diameter and a first length;
    (b) a second cylindrical region directly coupled to the outlet surface, the second cylindrical region having a second diameter and a second length; and (c) a conical region positioned between the first and second cylindrical regions, the conical region having walls of a third length, wherein the walls diverge toward the outlet surface and the second length is at least 1.5 times as long as the third length.

17. A gas distribution plate for distributing gases within a process chamber, the gas distribution plate comprising an inlet surface, an outlet surface, and a plurality of apertures formed between the inlet and outlet surfaces, each aperture comprising:

(a) a first cylindrical region having a first diameter and a first length;

(b) a second cylindrical region directly coupled to the outlet surface, the second cylindrical region having a second diameter and a second length; and (c) a conical region in communication with the first and second cylindrical regions, the conical region having walls of a third length, and wherein the walls of the conical region diverge toward the outlet surface and the second length is at least 1.5 times as long as the third length.

18. A gas distribution plate for distributing gases within a process chamber, the gas distribution plate comprising an inlet surface, an outlet surface, and a plurality of apertures formed between the inlet and outlet surfaces, each aperture comprising:

(a) a first cylindrical region directly coupled to the inlet surface, the first cylindrical region having a first diameter and a first length;

(b) a second cylindrical region directly coupled to the outlet surface, the second cylindrical region having a second diameter and a second length;

(c) a first conical region directly coupled to the first cylindrical region; and (d) a second conical region directly coupled to the second cylindrical region, the second conical region having walls of a third length, and wherein the second length is at least 1.5 times as long as the third length.

19. The gas distribution plate of claim 18, wherein the walls of the first conical region form an angle between about 25 degrees and 45 degrees.

20. The gas distribution plate of claim 18, further comprising a third cylindrical region positioned between the first conical region and the second conical region.

21. The gas distribution plate of claim 20, wherein the third cylindrical region is directly coupled to the first conical region and the second conical region.

22. The gas distribution plate of claim 20, wherein the third cylindrical region has a third diameter, and wherein the third diameter is less than each of the first diameter and the second diameter.

* * * * *